United States Patent
Schumacher et al.

(10) Patent No.: US 8,920,199 B2
(45) Date of Patent: Dec. 30, 2014

(54) PATCH CORD HAVING A PLUG WITH DIFFERENTIAL TRANSMISSION LINES

(71) Applicant: CommScope, Inc. of North Carolina, Hickory, NC (US)

(72) Inventors: Richard A. Schumacher, Dallas, TX (US); Amid I. Hashim, Plano, TX (US); Brian J. Fitzpatrick, McKinney, TX (US); Bryan S. Moffitt, Red Bank, NJ (US); Wayne D. Larsen, Wylie, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 48 days.

(21) Appl. No.: 13/802,882

(22) Filed: Mar. 14, 2013

(65) Prior Publication Data

US 2013/0210289 A1  Aug. 15, 2013

Related U.S. Application Data

(63) Continuation-in-part of application No. 13/762,433, filed on Feb. 8, 2013.

(60) Provisional application No. 61/597,918, filed on Feb. 13, 2012, provisional application No. 61/755,581, filed on Jan. 23, 2013.

(51) Int. Cl.
*H01R 24/00* (2011.01)
(Continued)

(52) U.S. Cl.
CPC .............. *H01R 23/005* (2013.01); *H01R 12/53* (2013.01); *H01R 24/28* (2013.01);
(Continued)

(58) Field of Classification Search
CPC ............. H01R 23/005; H01R 23/6625; H01R 23/6658
USPC .............................................. 439/676, 620.22
See application file for complete search history.

(56) References Cited

U.S. PATENT DOCUMENTS 5,205,762 A   4/1993 Carney
5,997,358 A  12/1999 Adriaenssens et al.
(Continued)

FOREIGN PATENT DOCUMENTS

DE  10 2006 010 279 A1  9/2007
EP       2 360 796 A1    8/2011
(Continued)

OTHER PUBLICATIONS

Notification of Transmittal of the International Preliminary Report on Patentability, for corresponding application PCT/US2013/025316, Date of Mailing: Mar. 17, 2014, 8 pages.

(Continued)

*Primary Examiner* — Chandrika Prasad
(74) *Attorney, Agent, or Firm* — Myers Bigel Sibley & Sajovec, P.A.

(57) ABSTRACT

Patch cords are provided that include a communications cable that has at least first through fourth conductors and a plug that is attached to the cable. The plug includes a housing that receives the cable, a printed circuit board, first through fourth plug contacts, and first through fourth conductive paths that connect the first through fourth conductors to the respective first through fourth plug contacts. The first and second conductors, conductive paths, and plug contacts form a first differential transmission line, and the third and fourth conductors, conductive paths, and plug contacts form a second differential transmission line. Each of the first through fourth plug contacts has a first segment that extends longitudinally along a first surface of the printed circuit board, and the signal current injection point into the first segment of at least some of the first through fourth plug contacts is into middle portions of their respective first segments.

22 Claims, 10 Drawing Sheets

(51) Int. Cl.
*H01R 24/64* (2011.01)
*H05K 1/11* (2006.01)
*H01R 13/6469* (2011.01)
*H01R 13/6466* (2011.01)
*H05K 1/02* (2006.01)
*H01R 13/66* (2006.01)
*H01R 12/53* (2011.01)
*H01R 24/28* (2011.01)
*H05K 1/16* (2006.01)

(52) U.S. Cl.
CPC .............. *H01R 24/64* (2013.01); *H05K 1/117* (2013.01); *H01R 13/6469* (2013.01); *H05K 2201/1034* (2013.01); *H05K 1/162* (2013.01); *H05K 2201/0949* (2013.01); *H05K 2201/10356* (2013.01); *H01R 2201/04* (2013.01); *H01R 13/6466* (2013.01); *H05K 1/0228* (2013.01); *H01R 13/6658* (2013.01); *H05K 1/0245* (2013.01); *H05K 2201/09181* (2013.01)
USPC ..................................................... 439/752

(56) References Cited

U.S. PATENT DOCUMENTS

| | | | |
|---|---|---|---|
| 6,078,012 A | 6/2000 | Suzuki | |
| 6,194,652 B1 | 2/2001 | Ivan | |
| 6,244,906 B1 | 6/2001 | Hashim et al. | |
| 6,283,768 B1 | 9/2001 | Van Naarden | |
| 6,290,532 B1 | 9/2001 | Vermeersch et al. | |
| 6,617,939 B1 | 9/2003 | Vermeersch | |
| 6,764,333 B2 | 7/2004 | Pocrass | |
| 6,821,142 B1 | 11/2004 | Rayev et al. | |
| 7,201,618 B2 | 4/2007 | Ellis et al. | |
| 7,249,979 B2 | 7/2007 | Gerber et al. | |
| 7,281,957 B2 * | 10/2007 | Caveney | 439/676 |
| 7,427,218 B1 * | 9/2008 | Hashim et al. | 439/676 |
| 7,604,515 B2 | 10/2009 | Siemon et al. | |
| 7,857,635 B2 | 12/2010 | Goodrich et al. | |
| 7,980,899 B2 | 7/2011 | Siemon et al. | |
| 8,011,972 B2 * | 9/2011 | Caveney et al. | 439/676 |
| 8,083,551 B2 * | 12/2011 | Hetzer et al. | 439/676 |
| 8,197,286 B2 | 6/2012 | Larsen et al. | |
| 8,435,083 B2 * | 5/2013 | Hetzer et al. | 439/676 |
| 2004/0092154 A1 | 5/2004 | Doorhy et al. | |
| 2004/0116081 A1 | 6/2004 | Crudele et al. | |
| 2006/0131056 A1 | 6/2006 | Hackman | |
| 2007/0161296 A1 | 7/2007 | Carroll et al. | |
| 2007/0243728 A1 | 10/2007 | Ellis et al. | |
| 2008/0132123 A1 * | 6/2008 | Milette et al. | 439/676 |
| 2010/0003863 A1 | 1/2010 | Siemon et al. | |
| 2010/0203763 A1 * | 8/2010 | Hetzer et al. | 439/620.22 |
| 2010/0317230 A1 * | 12/2010 | Larsen et al. | 439/620.22 |
| 2012/0100744 A1 | 4/2012 | Bolouri-Saransar et al. | |
| 2012/0164884 A1 * | 6/2012 | Hetzer et al. | 439/620.22 |
| 2013/0210289 A1 * | 8/2013 | Schumacher et al. | 439/676 |

FOREIGN PATENT DOCUMENTS

| | | |
|---|---|---|
| JP | 2008-103318 A | 5/2008 |
| WO | WO 96/37015 | 11/1996 |
| WO | WO 2006/081423 A1 | 8/2006 |

OTHER PUBLICATIONS

International Search Report Corresponding to International Application No. PCT/US2013/025316; Date of Mailing: Jun. 28, 2013; 20 Pages.

European Search Report for corresponding Application No. 14151014.9, mailing dated Jul. 16, 2014, 6 pages.

* cited by examiner

PATCH CORD HAVING A PLUG WITH DIFFERENTIAL TRANSMISSION LINES

CROSS-REFERENCE TO RELATED APPLICATIONS

The present application claims priority under 35 U.S.C. §§119(e) and 120 to U.S. Provisional Patent Application Ser. No. 61/755,581, filed Jan. 23, 2013, and to U.S. patent application Ser. No. 13/762,433, Feb. 8, 2013, which claims priority to U.S. Provisional Patent Application Ser. No. 61/597,918, filed Feb. 13, 2012, the disclosure of each of which is hereby incorporated herein by reference in its entirety.

FIELD OF THE INVENTION

The present invention relates generally to communications connectors and, more particularly, to communications connectors such as modular plugs that may exhibit improved crosstalk, return loss and/or insertion loss performance.

BACKGROUND

Many hardwired communications systems use plug and jack connectors to connect a communications cable to another communications cable or to computer equipment. By way of example, high speed communications systems routinely use such plug and jack connectors to connect computers, printers and other devices to local area networks and/or to external networks such as the Internet. FIG. 1 depicts a highly simplified example of such a hardwired high speed communications system that illustrates how plug and jack connectors may be used to interconnect a computer 11 to, for example, a network server 20.

As shown in FIG. 1, the computer 11 is connected by a cable 12 to a communications jack 15 that is mounted in a wall plate 19. The cable 12 is a patch cord that includes a communications plug 13, 14 at each end thereof. Typically, the cable 12 includes eight insulated conductors. As shown in FIG. 1, plug 14 is inserted into an opening or "plug aperture" 16 in the front side of the communications jack 15 so that the contacts or "plug blades" of communications plug 14 mate with respective contacts of the communications jack 15. If the cable 12 includes eight conductors, the communications plug 14 and the communications jack 15 will typically each have eight contacts. The communications jack 15 includes a wire connection assembly 17 at the back end thereof that receives a plurality of conductors (e.g., eight) from a second cable 18 that are individually pressed into slots in the wire connection assembly 17 to establish mechanical and electrical connections between each conductor of the second cable 18 and a respective one of a plurality of conductive paths through the communications jack 15. The other end of the second cable 18 is connected to a network server 20 which may be located, for example, in a telecommunications closet of a commercial office building. Communications plug 13 similarly is inserted into the plug aperture of a second communications jack (not pictured in FIG. 1) that is provided in the back of the computer 11. Thus, the patch cord 12, the cable 18 and the communications jack 15 provide a plurality of electrical paths between the computer 11 and the network server 20. These electrical paths may be used to communicate electrical information signals between the computer 11 and the network server 20.

When a signal is transmitted over a conductor (e.g., an insulated copper wire) in a communications cable, electrical noise from external sources may be picked up by the conductor, degrading the quality of the signal. In order to counteract such noise sources, the information signals in the above-described communications systems are typically transmitted between devices over a pair of conductors (hereinafter a "differential pair" or simply a "pair") rather than over a single conductor. The two conductors of each differential pair are twisted tightly together in the communications cables and patch cords so that the eight conductors are arranged as four twisted differential pairs of conductors. The signals transmitted on each conductor of a differential pair have equal magnitudes, but opposite phases, and the information signal is embedded as the voltage difference between the signals carried on the two conductors of the pair. When the signal is transmitted over a twisted differential pair of conductors, each conductor in the differential pair often picks up approximately the same amount of noise from these external sources. Because the information signal is extracted by taking the difference of the signals carried on the two conductors of the differential pair, the subtraction process may mostly cancel out the noise signal, and hence the information signal is typically not disturbed.

Referring again to FIG. 1, it can be seen that a series of plugs, jacks and cable segments connect the computer 11 to the server 20. Each plug, jack and cable segment includes four differential pairs, and thus a total of four differential transmission lines are provided between the computer 11 and the server 20 that may be used to carry two way communications therebetween (e.g., two of the differential pairs may be used to carry signals from the computer 11 to the server 20, while the other two may be used to carry signals from the server 20 to the computer 11). The cascaded plugs, jacks and cabling segments shown in FIG. 1 that provide connectivity between two end devices (e.g., computer 11 and server 20) is referred to herein as a "channel." Thus, in most high speed communications systems, a "channel" includes four differential pairs. Unfortunately, the proximities of the conductors and contacting structures within each plug-jack connection (e.g., where plug 14 mates with jack 15) can produce capacitive and/or inductive couplings. These capacitive and inductive couplings in the connectors (and similar couplings that may arise in the cabling) give rise to another type of noise that is known as "crosstalk."

In particular, "crosstalk" refers to unwanted signal energy that is capacitively and/or inductively coupled onto the conductors of a first "victim" differential pair from a signal that is transmitted over a second "disturbing" differential pair. The induced crosstalk may include both near-end crosstalk (NEXT), which is the crosstalk measured at an input location corresponding to a source at the same location (i.e., crosstalk whose induced voltage signal travels in an opposite direction to that of an originating, disturbing signal in a different path), and far-end crosstalk (FEXT), which is the crosstalk measured at the output location corresponding to a source at the input location (i.e., crosstalk whose signal travels in the same direction as the disturbing signal in the different path). Both types of crosstalk comprise an undesirable noise signal that interferes with the information signal that is transmitted over the victim differential pair.

While methods are available that can significantly reduce the effects of crosstalk within communications cable segments, the communications connector configurations that were adopted years ago—and which still are in effect in order to maintain backwards compatibility—generally did not arrange the contact structures so as to minimize crosstalk between the differential pairs in the connector hardware. For example, pursuant to the ANSI/TIA-568-C.2 standard approved Aug. 11, 2009 by the Telecommunications Industry Association, in the connection region where the contacts of a modular plug mate with the contacts of the modular jack (referred to herein as the "plug-jack mating region"), the eight contacts 1-8 of the jack must be aligned in a row, with the eight contacts 1-8 arranged as four differential pairs specified as depicted in FIG. 2. As known to those of skill in the art, under the TIA/EIA 568 type B configuration, contacts 4 and 5 in FIG. 2 comprise pair 1, contacts 1 and 2 comprise pair 2, contacts 3 and 6 comprise pair 3, and contacts 7 and 8 comprise pair 4. As is apparent from FIG. 2, this arrangement of the eight contacts 1-8 will result in unequal coupling between the differential pairs, and hence both NEXT and FEXT is introduced in each connector in industry standardized communications systems.

As hardwired communications systems have moved to higher frequencies in order to support increased data rate communications, crosstalk in the plug and jack connectors has became a more significant problem. To address this problem, communications jacks now routinely include crosstalk compensation circuits that introduce compensating crosstalk that is used to cancel much of the "offending" crosstalk that is introduced in the plug jack mating region as a result of the industry-standardized connector configurations. Typically, so-called "multi-stage" crosstalk compensation circuits are used. Such crosstalk circuits are described in U.S. Pat. No. 5,997,358 to Adriaenssens et al., the entire content of which is hereby incorporated herein by reference as if set forth fully herein.

Another important parameter in communications connectors is the return loss that is experienced along each differential pair (i.e., differential transmission line) through the connector. The return loss of a transmission line is a measure of how well the transmission line is impedance matched with a terminating device or with loads that are inserted along the transmission line. In particular, the return loss is a measure of the signal power that is lost due to signal reflections that may occur at discontinuities (impedance mismatches) in the transmission line. Return loss is typically expressed as a ratio in decibels (dB) as follows:

$$RL(dB) = 10\log_{10}\frac{P_i}{P_r}$$

where RL(dB) is the return loss in dB, $P_i$ is the incident power and $P_r$ is the reflected power. High return loss values indicate a good impedance match (i.e., little signal loss due to reflection), which results in lower insertion loss values, which is desirable.

SUMMARY

Pursuant to embodiments of the present invention, patch cords are provided that include a communications cable that includes at least first through fourth conductors and a plug that is attached to a first end of the cable. This plug includes a housing that receives the cable, a printed circuit board that is at least partly within the housing, and first through fourth plug contacts that each are at least partially within the housing. First through fourth conductive paths connect the respective first through fourth conductors to the respective first through fourth plug contacts. The first and second conductive paths are part of a first differential transmission line through the plug and the third and fourth conductive paths are part of a second differential transmission line through the plug. Each of the first through fourth plug contacts has a first segment that extends longitudinally above a top surface of the printed circuit board, and the signal current injection point into the first segment of at least some of the first through fourth plug contacts is into middle portions of their respective first segments.

In some embodiments, the plug-jack mating point on the first plug contact is on a top side of the first plug contact, and the signal current injection point into the first plug contact is on a bottom side of the first plug contact substantially opposite this plug-jack mating point. Substantially the entirety of the first segment of the first plug contact may rest directly on the top surface of the printed circuit board. The first through fourth plug contacts may also each have a respective second segment that extends downwardly from an end of the respective first segments along a front edge of the printed circuit board. A minimum signal current-carrying path through the first plug contact may be less than twice a height of the first plug contact above a top surface of the printed circuit board. The respective signal current injection points into the first and third plug contacts may be aligned in a first transverse row, and the respective signal current injection points into the second and fourth plug contacts may be aligned in a second transverse row that is offset from the first transverse row.

In some embodiments, the printed circuit board may include a plurality of conductive vias, and each of the first through fourth plug contacts may have a downwardly extending projection that is received within a respective one of the conductive vias. In such embodiments, the conductive vias that receive the downwardly extending projections of the first and third plug contacts may be aligned in a first row, and the conductive vias that receive the downwardly extending projections of the second and fourth plug contacts may be aligned in a second row that is offset from a first row.

In some embodiments, the first segments of the first through fourth plug contacts may be substantially identical and may be transversely aligned in a row, and substantially the entirety of the first segment of each of the first through fourth plug contacts may rest directly on the top surface of the printed circuit board. The signal current-carrying path through each of the first through fourth plug contacts may be offset in a longitudinal dimension of the plug from the signal current-carrying path of at least an adjacent one of the first through fourth plug contacts.

In some embodiments, the plug may be an RJ-45 plug that further includes fifth and sixth plug contacts that are part of a third differential transmission line through the plug and seventh and eighth plug contacts that are part of a fourth differential transmission line through the plug, wherein the first, third, fifth and seventh plug contacts are mounted in respective first through fourth conductive vias that are aligned in a first row and the second, fourth, sixth and eighth plug contacts are mounted in respective fifth through eighth conductive vias that are aligned in a second row that is offset from the first row. In some embodiments, the first through fourth plug contacts may extend no more than 90 mils above a top surface of the printed circuit board. In other embodiments, the first through fourth plug contacts may extend no more than 60 mils above a top surface of the printed circuit board. In still other embodiments, the first through fourth plug contacts may extend no more than 30 mils above a top surface of the printed circuit board. In fact, in some embodiments, the first through fourth plug contacts may extend no more than 10 mils above a top surface of the printed circuit board. These low profile plug contacts may generate substantially less offending crosstalk as compared to conventional plug blades.

In some embodiments, the plug further includes an offending crosstalk capacitor that injects offending crosstalk between the second conductive path and the third conductive path. This offending crosstalk capacitor may be a printed circuit board capacitor that injects offending crosstalk onto the second conductive path substantially at a first interface between the second plug contact and the printed circuit board, and onto the third conductive path substantially at a second interface between the third plug contact and the printed circuit board. In other embodiments, the offending crosstalk capacitor may be configured to inject offending crosstalk onto the second conductive path at a point in time that is after the point in time when a signal transmitted through the second plug contact to a contact of a mating jack reaches the contact of the mating jack.

Pursuant to embodiments of the present invention, patch cords are provided that include a communications cable that includes at least first through fourth conductors and an RJ-45 plug that is attached to a first end of the cable. This plug includes a housing that receives the cable, a printed circuit board that is at least partly within the housing, and first through fourth plug contacts that each are at least partially within the housing. First through fourth conductive paths connect the respective first through fourth conductors to the respective first through fourth plug contacts. The first and second conductive paths are part of a first differential transmission line through the plug and the third and fourth conductive paths are part of a second differential transmission line through the plug. A minimum signal current-carrying path through each of the first through fourth plug contacts is less than twice a respective height of the respective first through fourth plug contacts above a top surface of the printed circuit board.

In some embodiments, the signal current-carrying path through each of the first through fourth plug contacts may be offset in a longitudinal dimension of the plug from the signal current-carrying path of at least an adjacent one of the first through fourth plug contacts. The plug-jack mating point on each plug contact may be on a top side of the plug contact and the signal current injection point into each plug contact may be on a bottom side of the plug contact substantially opposite the plug-jack mating point. A minimum signal current-carrying path through each plug contact may be less than twice a height of the plug contact above a top surface of the printed circuit board.

In some embodiments, the plug may further include an offending crosstalk capacitor that injects offending crosstalk between the second conductive path and the third conductive path. The offending crosstalk capacitor may be configured to inject offending crosstalk onto the second conductive path at a point in time that is after the point in time when a signal transmitted through the second plug contact to a contact of a mating jack reaches the contact of the mating jack. In some embodiments, the offending crosstalk capacitor may be formed in the printed circuit board and may be electrically connected to the second and third plug contacts via respective electrical connections that are different than the electrical connections that are part of the signal current-carrying paths between the second and third plug contacts and the printed circuit board.

In some embodiments, the plug may be an RJ-45 plug and may include a stop surface on the front of the plug housing that is designed to engage an industry standards-defined stop in the jack to prevent further forward movement of the plug into the plug aperture of the jack. In such embodiments, a plug jack mating point on at least some of the first through fourth plug contacts may be at least 30 mils rearward of the stop surface when the plug is inserted as far forward as possible into a mating RJ-45 jack. In other embodiments, the plug-jack mating point on at least some of the first through fourth plug contacts may be at least 60 mils rearward of the stop surface when the plug is inserted as far forward as possible into a mating RJ-45 jack, or even as much as 90 mils rearward or more.

Pursuant to embodiments of the present invention, patch cords are provided that include a communications cable that includes at least first through fourth conductors and a plug that is attached to a first end of the cable. This plug includes a housing that receives the cable, a printed circuit board that is at least partly within the housing. The printed circuit board includes first through fourth vias. First through fourth plug contacts are mounted in the respective first through fourth vias. First through fourth conductive paths connect the respective first through fourth conductors to the respective first through fourth plug contacts. The first and second conductive paths are part of a first differential transmission line through the plug and the third and fourth conductive paths are part of a second differential transmission line through the plug. A fifth via that is part of the first conductive path is located in a portion of the printed circuit board that is underneath the first through fourth plug contacts. This fifth via is part of an offending crosstalk circuit. A sixth via that is part of the third conductive path is likewise located in the portion of the printed circuit board that is underneath the first through fourth plug contacts.

In some embodiments, the offending crosstalk circuit injects inductive crosstalk between the first conductive path and the fourth conductive path. A first trace of the printed circuit board that is part of the first conductive path may be positioned to inductively couple with a second trace on the printed circuit board that is part of the fourth conductive path to provide a second offending crosstalk circuit. The plug may include a second offending crosstalk circuit that includes the sixth via that injects inductive crosstalk between the second conductive path and the third conductive path. Each of the first through fourth plug contacts may have a first segment that extends longitudinally above a top surface of the printed circuit board, and the fifth via may be substantially transversely aligned with the sixth via. The first and third vias may be transversely aligned in a first row, and the second and fourth vias may be transversely aligned in a second row that is offset from a first row. The fifth via and the sixth via may be transversely aligned with the first and third vias.

DETAILED DESCRIPTION

Figure 1:
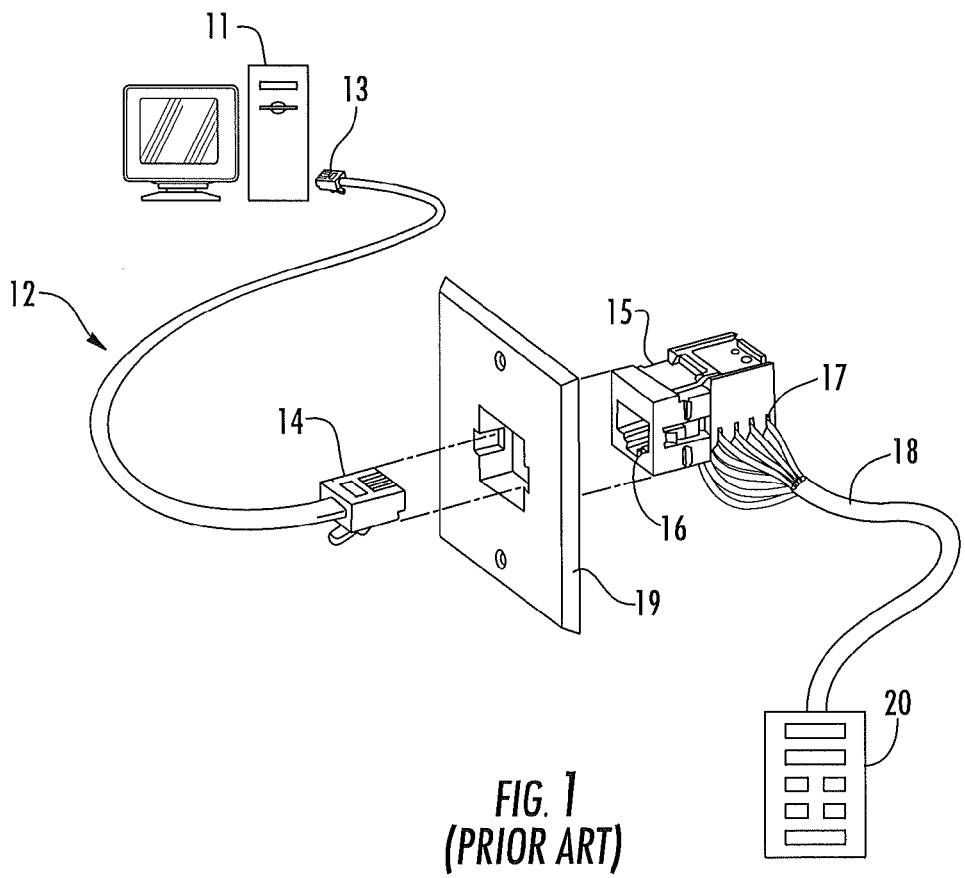
FIG. 1 is a simplified schematic diagram illustrating the use of conventional communications plugs and jacks to interconnect a computer with network equipment.
Figure 2:
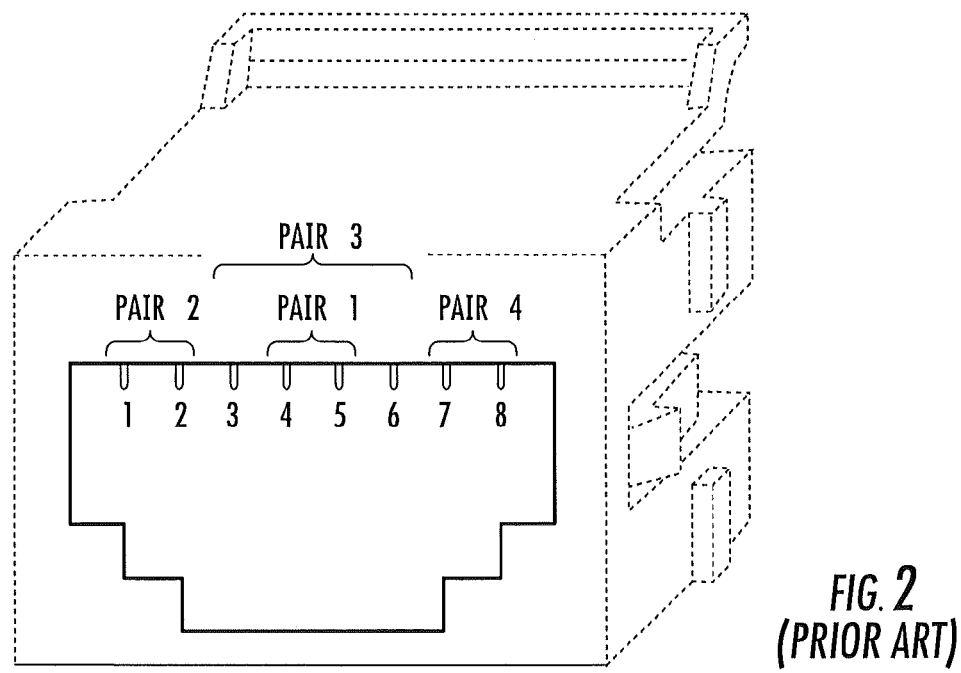
FIG. 2 is a schematic diagram illustrating the modular jack contact wiring assignments for a conventional 8-position communications jack (TIA 568B) as viewed from the front opening of the jack.

The present invention is directed to communications connectors such as RJ-45 plugs. As used herein, the terms "forward" and "front" and derivatives thereof refer to the direction defined by a vector extending from the center of the plug toward the portion of the plug that is first received within a plug aperture of a jack when the plug is mated with a jack. Conversely, the term "rearward" and derivatives thereof refer to the direction directly opposite the forward direction. The forward and rearward directions define the longitudinal dimension of the plug. The vectors extending from the center of the plug toward the respective sidewalls of the plug housing defines the transverse dimension of the plug. The transverse dimension is normal to the longitudinal dimension. The vectors extending from the center of the plug toward the respective top and bottom walls of the plug housing (where the top wall of the plug housing is the wall that includes slots that expose the plug blades) defines the vertical dimension of the plug. The vertical dimension of the plug is normal to both the longitudinal and transverse dimensions.

Pursuant to embodiments of the present invention, communications plugs, as well as patch cords that include such communications plugs, are provided that may exhibit excellent crosstalk, return loss and insertion loss performance. Some embodiments of these plugs may operate at frequencies supporting 40 gigabit communications.

In some embodiments, the communications plugs may include a printed circuit board and a plurality of low-profile plug contacts that are mounted on the top surface of the printed circuit board along a front edge thereof. The communications plug may comprise an RJ-45 plug that has eight plug contacts that are arranged as four differential pairs of plug contacts. Each of the plug contacts has a first segment that extends longitudinally above a top surface of the printed circuit board. The signal current injection point into the first segment of at least some of the plug contacts may be into middle portions of their respective first segments. Herein the "signal current injection point" into a plug contact refers to a point or region of the plug contact where electrical signals that are traversing the plug contact are transferred to a mating structure such as a mating jack contact, a printed circuit board, etc.

In some embodiments, the signal current injection points from the printed circuit board into the respective plug contacts may be aligned in two transverse rows. The signal current injection points into adjacent plug contacts may be staggered. For example, the plug may have first through eighth plug contacts that are aligned in numerical order in a row along a top surface of the printed circuit board in the transverse dimension of the plug, with the signal current injection points from the printed circuit board into plug contacts one, three, five and seven aligned in a first row and the signal current injection points from the printed circuit board into plug contacts two, four, six and eight aligned in a second row that is offset from the first row in the longitudinal dimension of the plug. This staggered arrangement may facilitate, among other things, reducing the amount of offending crosstalk between adjacent plug blades that is injected between differential pairs farther back in the plug (i.e., toward the wire connections in the plug) so that the vast bulk of the offending crosstalk may be injected close to the plug-jack mating point using offending crosstalk circuits. This may make it easier to effectively compensate for such offending crosstalk in a mating communications jack connector, as will be discussed in more detail below.

In some embodiments, the plug-jack mating point on each plug contact may be on a top side of the plug contact, and the signal current injection point into each plug contact may be on a bottom side of the plug contact substantially opposite the plug-jack mating point. This may provide for extremely short current paths through each plug contact, which may also facilitate providing improved crosstalk performance. Moreover, the low profile plug blades may extend, for example, less than 30 mils above a top surface of the printed circuit board. In some embodiments, the minimum signal current-carrying path through each plug contact may be less than three times a height of the plug contact above the top surface of the printed circuit board. In other embodiments, the minimum signal current-carrying path through each plug contact may less than twice the height of the plug contact above the top surface of the printed circuit board, and may even be equal to the height of the plug contact above the top surface of the printed circuit board. Thus, the signal current carrying path through the plug contacts may be as low as, for example, less than 30 mils.

In some embodiments, each plug contact may include a downward projection that is received within a respective one of a plurality of conductive vias in the printed circuit board that are used to mount the plug contacts to the printed circuit board. These conductive vias may be staggered in at least two longitudinally offset transverse rows. In some embodiments, the signal current is injected into each plug contact via these conductive vias.

Pursuant to further embodiments of the present invention, RJ-45 communications plugs (and related patch cords) are provided that include eight low profile plug contacts that are mounted in eight respective conductive vias to extend along the top surface of a printed circuit board along a front edge thereof. At least a ninth conductive via is provided that is disposed between two of the eight conductive vias. The ninth conductive via is part of a first offending inductive crosstalk circuit. In some embodiments, a tenth conductive via is provided that is also disposed between two of the eight conductive vias that is part of a second offending inductive crosstalk circuit. The ninth and tenth conductive vias may provide a mechanism for injecting relatively high levels of offending inductive crosstalk between differential transmission lines of the plug very close to the plug-jack mating point.

Embodiments of the present invention will now be discussed in greater detail with reference to the drawings.

Figure 3:
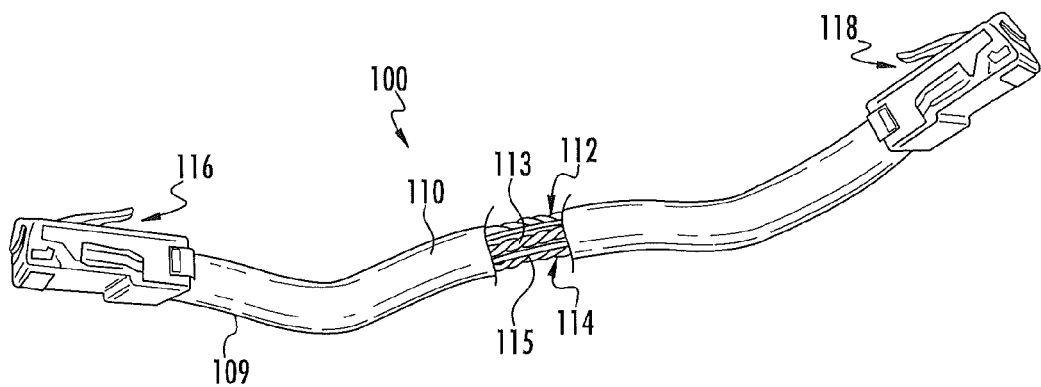
FIG. 3 is a perspective view of a patch cord according to certain embodiments of the present invention.
Figure 4:
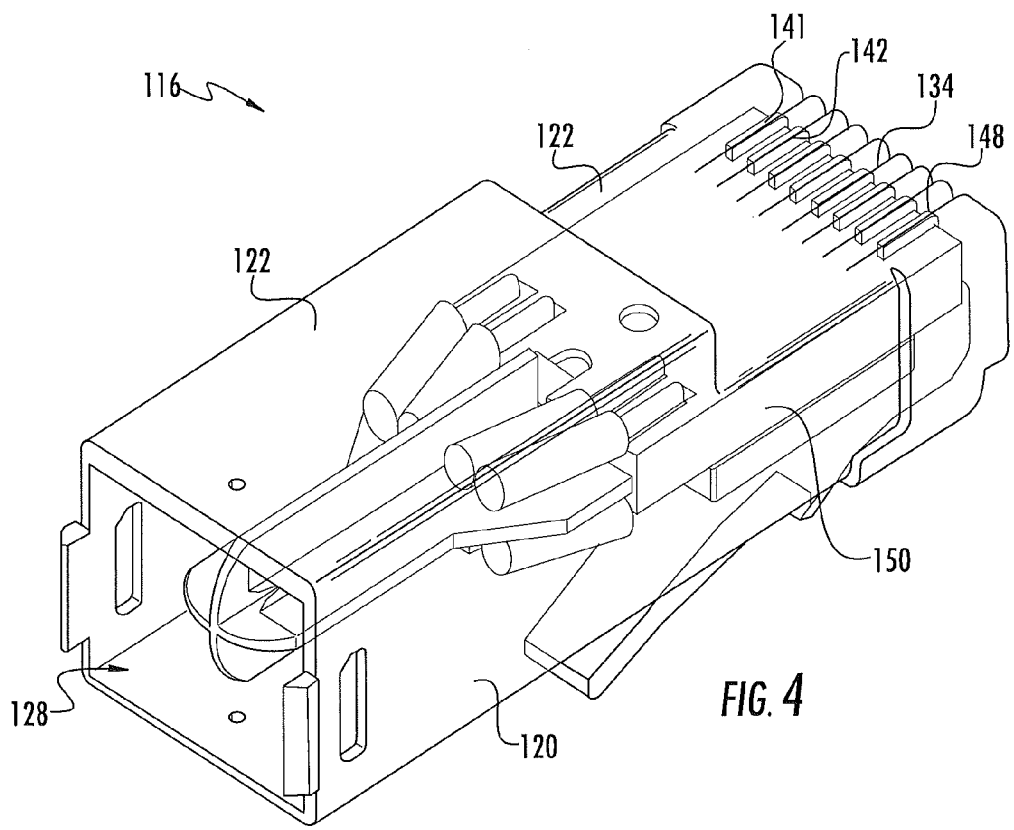
FIG. 4 is a top-rear perspective view of a plug that is included on the patch cord of FIG. 3.
Figure 5:
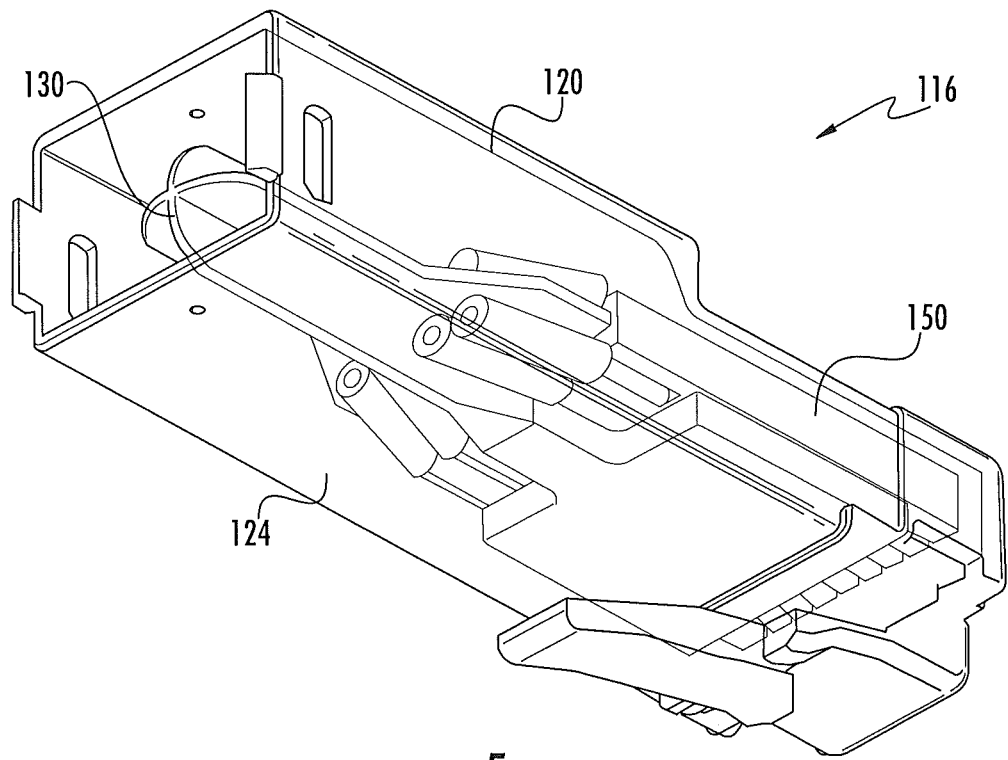
FIG. 5 is a bottom-rear perspective view of the plug of FIG. 4.
Figure 6:
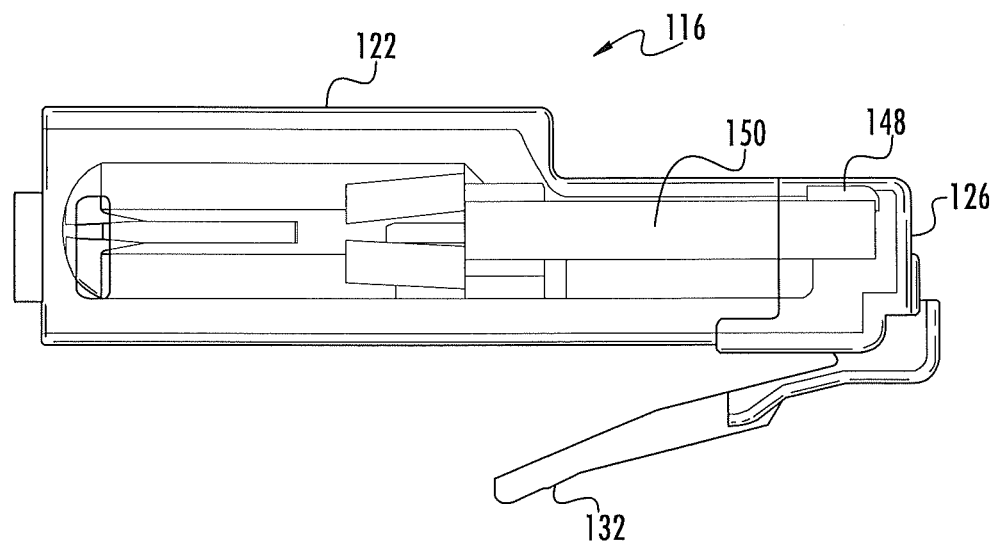
FIG. 6 is a side view of the plug of FIG. 4.
Figure 9:
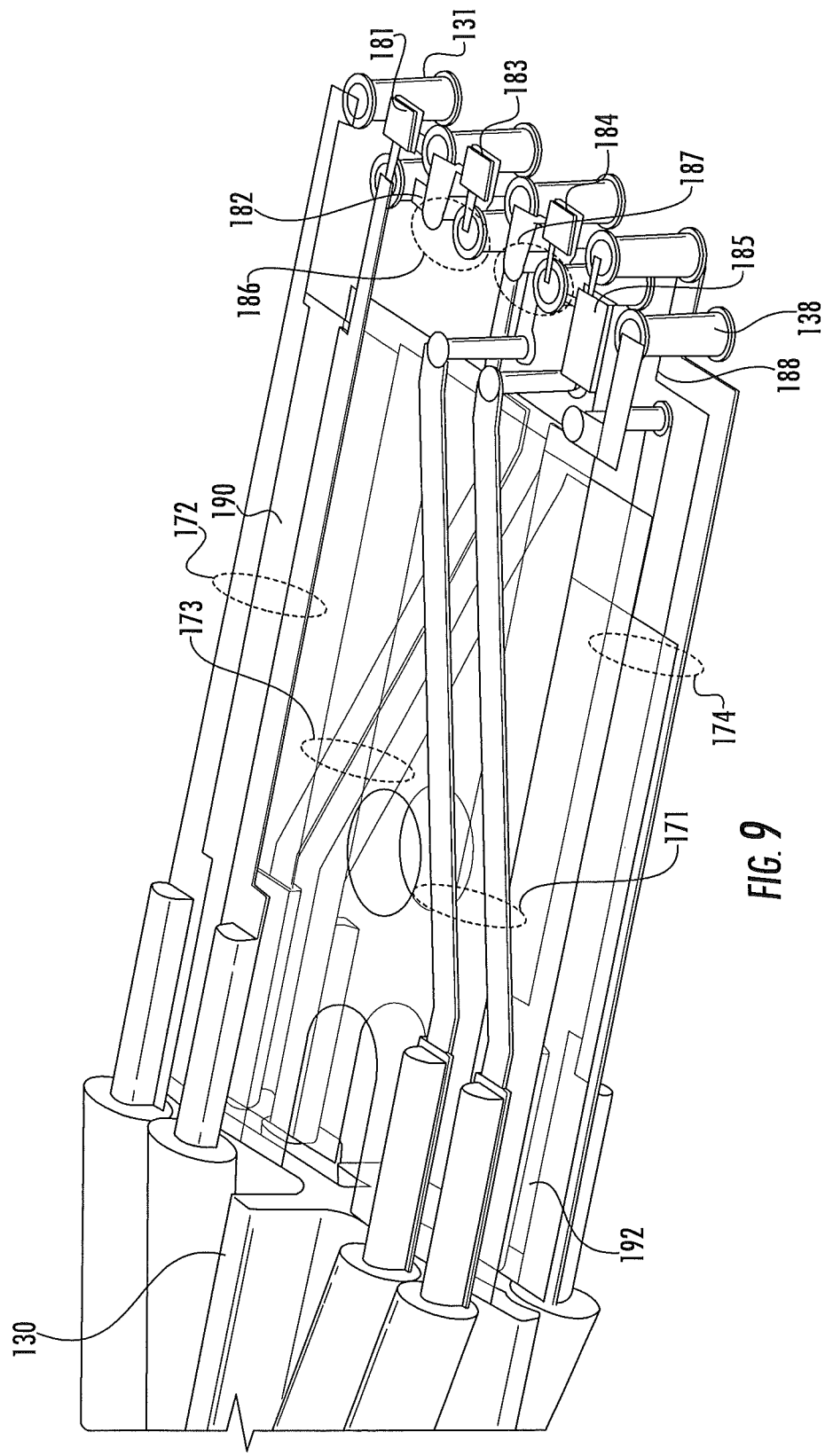
Figure 10:
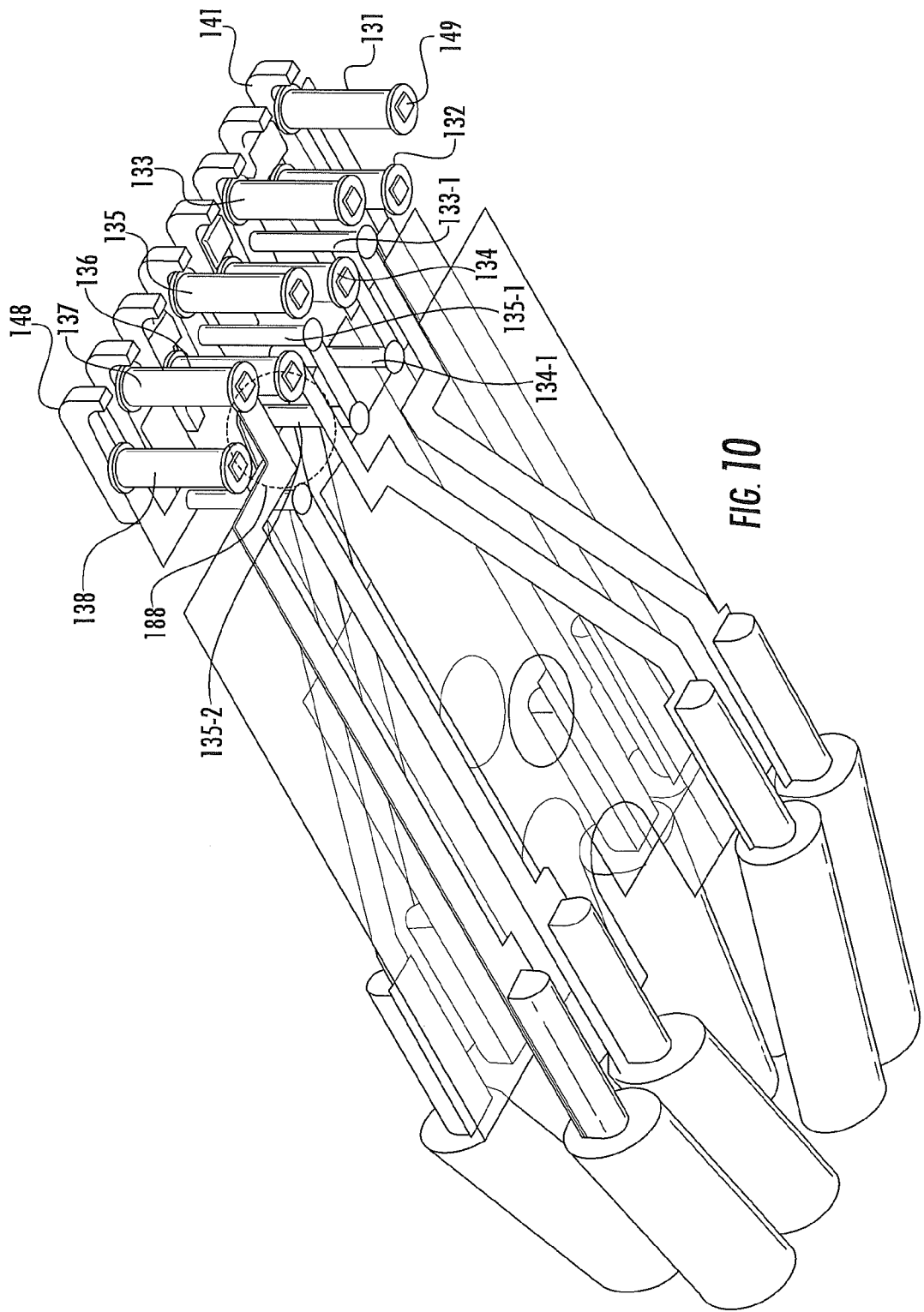
Figure 11:
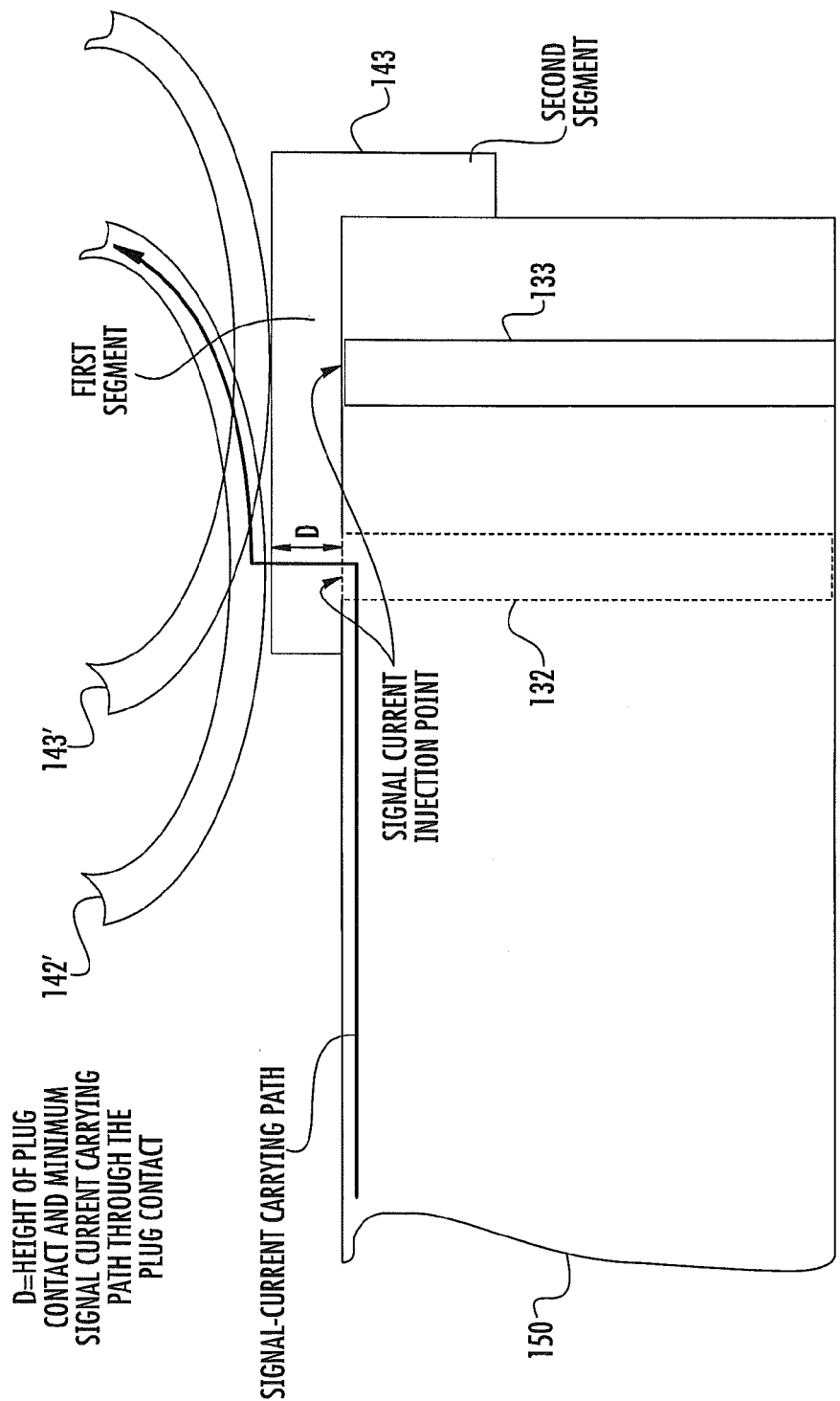
FIG. 11 is a schematic side cross-sectional view of the plug contacts and a front portion of the printed circuit board of the plug of FIGS. 4-6 shown mating with the jackwire contacts of a mating jack.

FIGS. 3-11 illustrate a patch cord 100 and various components thereof according to certain embodiments of the present invention. In particular, FIG. 3 is a perspective view of the patch cord 100. FIG. 4 is a top-rear perspective view of a plug 116 that is included on the patch cord 100 of FIG. 3. FIG. 5 is a bottom-rear perspective view of the plug 116. FIG. 6 is a side view of the plug 116. FIGS. 7-10 are various perspective views of the plug contacts 141-148 and a printed circuit board 150 of plug the 116 of FIGS. 4-6. FIG. 11 is a schematic side cross-sectional view of a front portion of the printed circuit board 150 and the plug contacts 141-148 shown mating with the jackwire contacts of a mating jack.

As shown in FIG. 3, the patch cord 100 includes a cable 109 that has eight insulated conductors 101-108 enclosed in a jacket 110 (the conductors 101-103 and 106-108 are not individually numbered in FIG. 3, and conductors 104 and 105 are not visible in FIG. 3). The insulated conductors 101-108 may be arranged as four twisted pairs of conductors, with conductors 104 and 105 twisted together to form twisted pair 111 (pair 111 is not visible in FIG. 3), conductors 101 and 102 twisted together to form twisted pair 112, conductors 103 and 106 twisted together to form twisted pair 113, and conductors 107 and 108 twisted together to form twisted pair 114. A separator 115 such as a tape separator or a cruciform separator may be provided that separates one or more of the twisted pairs 111-114 from one or more of the other twisted pairs 111-114. A first plug 116 is attached to a first end of the cable 109 and a second plug 118 is attached to the second end of the cable 109 to form the patch cord 100. Strain relief features (not shown) such as boots or ferrules, for example, may be attached to each of the plugs 116, 118 which resist the tendency for a longitudinal force applied to the cable 109 to pull the cable 109 out of the plugs 116, 118.

FIGS. 4-6 are enlarged views that illustrate the first plug 116 of the patch cord 100. A rear cap of the plug housing and various wire grooming and wire retention mechanisms are omitted to simplify these drawings. As shown in FIGS. 4-6, the communications plug 116 includes a housing 120 that has a bi-level top face 122, a bottom face 124, a front face 126, and a rear opening 128 that receives a rear cap (not shown). A plug latch 132 extends from the bottom face 124. The top and front faces 122, 126 of the housing 120 include a plurality of longitudinally extending slots 134. The communications cable 109 (see FIG. 3) is received through the rear opening 128. A rear cap (not shown) that includes a cable aperture locks into place over the rear opening 128 of housing 120 after the communications cable 109 has been inserted therein.

As is also shown in FIGS. 4-6, the communications plug 116 further includes a printed circuit board 150 which is disposed within the housing 120, and a plurality of plug contacts 141-148 in the form of low profile plug blades that are mounted at the forward edge of the printed circuit board 150 so that the blades 141-148 can be accessed through the slots 134 in the top face 122 and front face 126 of the housing 120. The housing 120 may be made of a suitable insulative plastic material that meets applicable standards with respect to, for example, electrical breakdown resistance and flammability such as, for example, polycarbonate, ABS, ABS/polycarbonate blend or other dielectric molded materials. Any conventional housing 120 may be used that is configured to hold the printed circuit board 150, and hence the housing 120 is not described in further detail herein.

Figure 7:
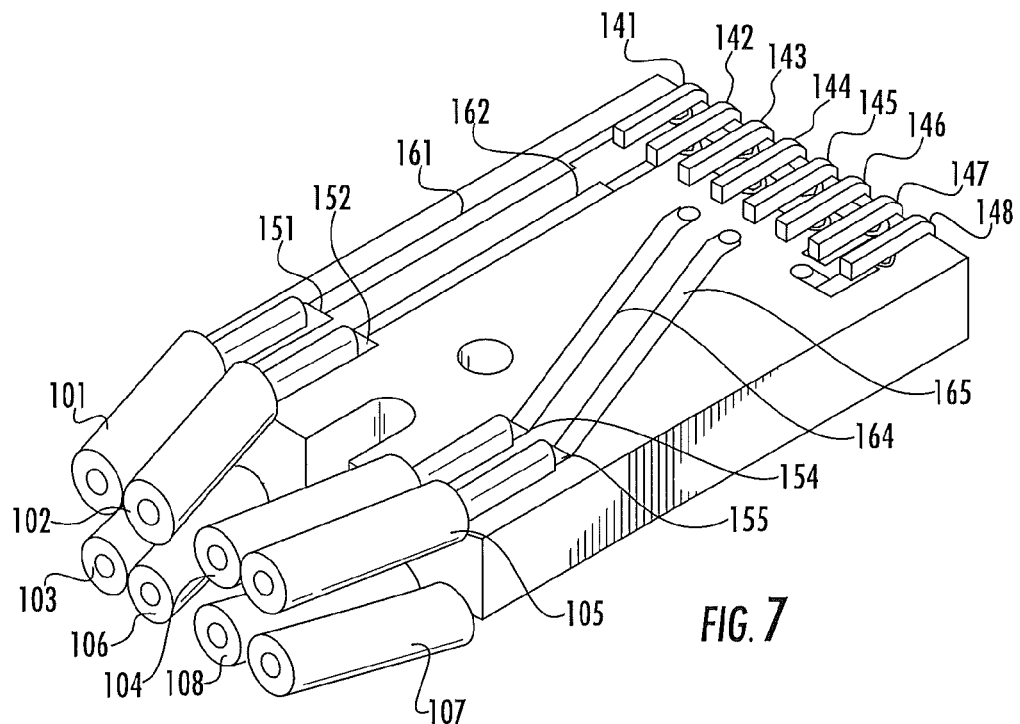
FIGS. 7-10 are various perspective views of the plug contacts and a printed circuit board of the plug of FIGS. 4-6.
Figure 8:
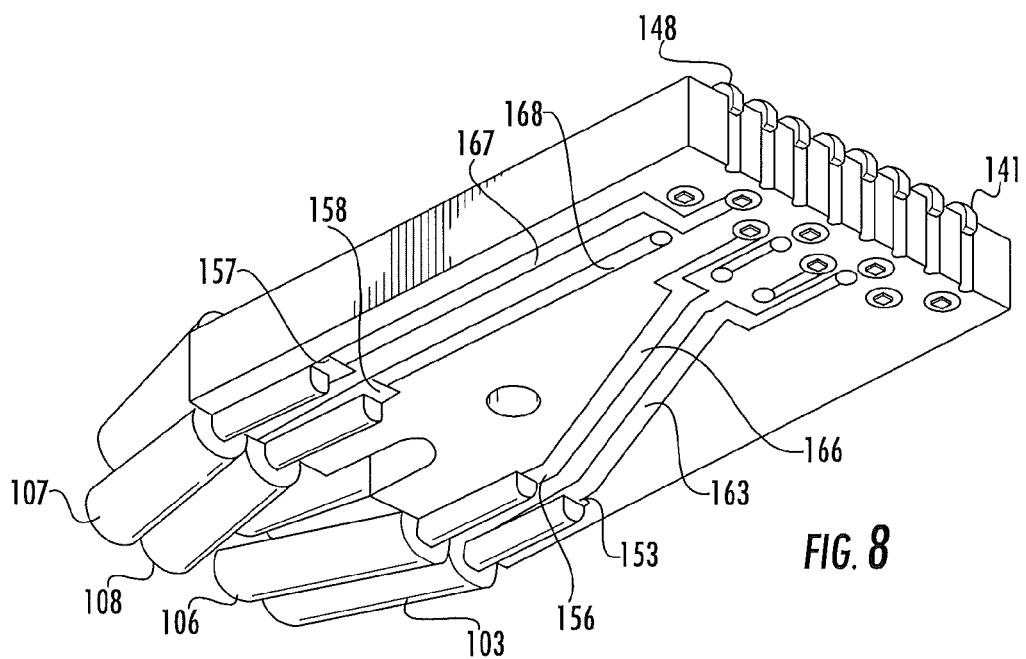

FIGS. 7 and 8 are enlarged perspective top and bottom views, respectively, of the printed circuit board 150 and the plug blades 141-148 that illustrate these structures in greater detail and that show how the insulated conductors 101-108 of communications cable 109 may be electrically connected to the respective plug blades 141-148 through the printed circuit board 150. FIGS. 9 and 10 are enlarged perspective top and bottom views, respectively, of the top and bottom surfaces of the printed circuit board 150 and the plug blades 141-148. In FIGS. 9 and 10, the dielectric portion of the printed circuit board 150 is omitted in order to better illustrate certain features of the printed circuit board 150. In FIG. 9, only the downwardly extending projections of the plug blades 141-148 that are received in the conductive vias 131-138 are shown in order to better illustrate various offending crosstalk circuits that are included in the plug 116.

The printed circuit board 150 may comprise, for example, a conventional printed circuit board, a specialized printed circuit board (e.g., a flexible printed circuit board) or any other appropriate type of wiring board. In the embodiment of the present invention depicted in FIGS. 3-10, the printed circuit board 150 comprises a conventional multi-layer printed circuit board.

As shown in FIGS. 7-10, the printed circuit board 150 includes four plated pads 151, 152, 154, 155 on a top surface thereof and an additional four plated pads 153, 156-158 on a bottom surface thereof. The insulation is removed from an end portion of each of the conductors 101-108, and the metal (e.g., copper) core of each conductor 101-108 may be soldered, welded or otherwise attached to a respective one of the plated pads 151-158. By terminating each of the conductors 101-108 directly onto the plated pads 151-158 without the use of any insulation displacement contacts, insulation piercing contacts or other wire connection contacts, the size of the plug 116 may be reduced. It will also be appreciated that other techniques may be used for terminating the conductors 101-108 to the printed circuit board 150. For example, in other embodiments, a plurality of insulation piercing contacts or insulation displacement contacts may be mounted on the printed circuit board 150 that are used to electrically connect each conductor 101-108 to a respective trace on the printed circuit board 150. It will be appreciated that in other embodiments the conductors 101-108 may attached to the top and bottom surfaces of the printed circuit board 150 according to different groupings than above mentioned. For example, six of the conductors 101-108 may be assigned to the top surface and two of the conductors may be assigned to the bottom surface or vice versa. Alternatively, all of the conductors 101-108 may be mounted exclusively on the bottom surface of the printed circuit board 150 or exclusively on the top surface of the printed circuit board 150.

The conductors 101-108 may be maintained in pairs within the plug 116. A cruciform separator 130 may be included in the rear portion of the housing 120 that separates each pair 111-114 from the other pairs 111-114 in the cable 109 to reduce crosstalk in the plug 116. The conductors 101-108 of each pair 111-114 may be maintained as a twisted pair all of the way from the rear opening 128 of plug 116 up to the printed circuit board 150.

The plug blades 141-148 are configured to make mechanical and electrical contact with respective contacts, such as, for example, spring jackwire contacts, of a mating communications jack. In particular, as shown best in FIGS. 7-8 and 10, each of the eight plug blades 141-148 is mounted at the front portion of the printed circuit board 150. The plug blades 141-148 may be substantially transversely aligned in a side-by-side relationship. Each of the plug blades 141-148 includes a first section that extends forwardly (longitudinally) along a top surface of the printed circuit board 150, a transition section that curves through an angle of approximately ninety degrees and a second section that extends downwardly from the first section along a portion of the front edge of the printed circuit board 150. The transition section may include a curved outer radius that complies with the specification set forth in, for example, IEC 60603-7-4 for industry standards compliant plug blades. The portion of each plug blade 141-148 that is in physical contact with a contact structure (e.g., a jackwire contact) of a mating jack when the plug 116 is fully received within the plug aperture of the mating jack is referred to herein as the "plug jack mating point" of the plug contact 141-148.

Each of the plug blades 141-148 may be fabricated separately from the printed circuit board 150. In the depicted embodiment, each of the plug blades 141-148 comprise, for example, an elongated metal strip having a length of approximately 140 mils, a width of approximately 20 mils and a height (i.e., a thickness) of approximately 20 mils. Each plug blade 141-148 may also include a projection 149 that extends downwardly from the bottom surface of the first section of the plug blade (see FIGS. 9-10). The printed circuit board 150 includes eight metal-plated vias 131-138 that are arranged in two rows along the front edge thereof. The projections 149 of each plug blade 141-148 is received within a respective one of the metal-plated vias 131-138 where it may be press-fit, welded or soldered into place to mount the plug blades 141-148 on the printed circuit board 150.

The plug blades 141-148 may be mounted to the printed circuit board 150 in other ways. For example, in other embodiments, elongated contact pads may be provided on the top surface of the printed circuit board 150 and each plug blade 141-148 may be welded or soldered to a respective one of these contact pads. It will be appreciated that many other attachment mechanisms may be used. Further embodiments that include plug blades that are soldered to contact pads are discussed below.

Turning again to FIGS. 7-10 it can be seen that a plurality of conductive paths 161-168 are provided on the top and bottom surfaces of the printed circuit board 150. Each of these conductive paths 161-168 electrically connects one of the plated pads 151-158 to a respective one of the metal-plated vias 131-138 so as to provide a conductive path between each of the conductors 101-108 that are terminated onto the plated pads 151-158 and a respective one of the plug blades 141-148 that are mounted in the metal-plated vias 131-138. Each conductive path 161-168 may comprise, for example, one or more conductive traces that are provided on one or more layers of the printed circuit board 150. When a conductive path 161-168 includes conductive traces that are on multiple layers of the printed circuit board 150 (i.e., conductive paths 163-165 and 168 in the depicted embodiment), metal-plated or metal-filled through holes (or other layer-transferring structures known to those skilled in this art) may be provided that provide an electrical connection between the conductive traces on different layers of the printed circuit board 150.

A total of four differential transmission lines 171-174 are provided through the plug 116. The first differential transmission line 171 includes the end portions of conductors 104 and 105, the plated pads 154 and 155, the conductive paths 164 and 165, the plug blades 144 and 145, and the metal-plated vias 134, 135. The second differential transmission line 172 includes the end portions of conductors 101 and 102, the plated pads 151 and 152, the conductive paths 161 and 162, the plug blades 141 and 142, and the metal-plated vias 131, 132. The third differential transmission line 173 includes the end portions of conductors 103 and 106, the plated pads 153 and 156, the conductive paths 163 and 166, the plug blades 143 and 146, and the metal-plated vias 133, 136. The fourth differential transmission line 174 includes the end portions of conductors 107 and 108, the plated pads 157 and 158, the conductive paths 167 and 168, the plug blades 147 and 148, and the metal-plated vias 137, 38. As shown in FIGS. 7-10, the two conductive traces 161-168 that form each of the differential transmission lines 171-174 are generally run together, side-by-side, on the printed circuit board 150, which may provide improved impedance matching.

A plurality of offending crosstalk circuits are also included on the printed circuit board 150. As noted above, "offending" crosstalk unavoidably arises when the industry standardized RJ-45 plug-jack interface is used due to the unequal coupling that occurs between the four differential transmission lines through RJ-45 plugs and jacks in the plug-jack mating region of the plug contacts. In order to reduce the impact of this offending crosstalk, communications jacks were developed in the early 1990s that included circuits that introduced compensating crosstalk that was used to cancel much of the "offending" crosstalk that was being introduced in the plug-jack mating region. In particular, in order to cancel the "offending" crosstalk that is generated in a plug-jack connector because a first conductor of a first differential pair inductively and/or capacitively couples more heavily with a first of the two conductors of a second differential pair than does the second conductor of the first differential pair, jacks were designed so that the second conductor of the first differential pair would capacitively and/or inductively couple with the first of the two conductors of the second differential pair later in the jack to provide a "compensating" crosstalk signal. As the first and second conductors of the differential pair carry equal magnitude, but opposite phase signals, so long as the magnitude of the "compensating" crosstalk signal that is induced in such a fashion is equal to the magnitude of the "offending" crosstalk signal, then the compensating crosstalk signal that is introduced later in the jack may substantially cancel out the offending crosstalk signal. As noted above, multi-stage crosstalk compensation techniques have also been developed where two (or more) crosstalk stages having alternating polarities are provided in the jack, which may provide enhanced crosstalk compensation, particularly for higher frequency signals, as is discussed in the above-referenced U.S. Pat. No. 5,997,358.

In order to ensure that plugs and jacks manufactured by different vendors will work well together, the industry standards specify amounts of offending crosstalk that must be generated between the various differential pair combinations in an RJ-45 plug for that plug to be industry-standards compliant. Thus, while it is now possible to manufacture RJ-45 plugs that exhibit much lower levels of offending crosstalk, it is still necessary to ensure that RJ-45 plugs inject the industry-standardized amounts of offending crosstalk between the differential pairs so that backwards compatibility will be maintained with the installed base of RJ-45 plugs and jacks.

Pursuant to embodiments of the present invention, RJ-45 plugs are provided such as plug 116 that use PCB-mounted low profile plug blades. The terminations of the conductors 101-108 onto the printed circuit board 150, the routings of the conductive paths 161-168, and the low profile plug blades 141-148 are designed so that the amount of offending crosstalk that is generated between the differential pairs 171-174 by these features may be less, and perhaps significantly, less, than the offending crosstalk levels specified in the relevant industry-standards documents. A plurality of offending crosstalk circuits are then used to inject additional offending crosstalk between the pairs in order to bring the RJ-45 plug 116 into compliance with these industry standards documents.

The above-described approach may be beneficial, for example, because if everything else is held equal, more effective crosstalk cancellation may generally be achieved the closer the point of injection of the compensating crosstalk (or at least the first stage of compensating crosstalk) is to the point where the offending crosstalk is injected. The RJ-45 plug 116 is designed to generate low levels of offending crosstalk in the back portion of the plug (i.e., in portions of the plug 116 that are at longer electrical delays from the plug-jack mating regions of the plug blades 141-148). Furthermore, a plurality of offending crosstalk circuits are provided at very short delays from the plug-jack mating regions of the plug blades 141-148 which are used to bring the offending crosstalk to the level required to comply with the industry standards. In this manner, a large portion of the crosstalk generated in the plug 116 is generated at a very small delay from the plug-jack mating regions of the plug blades 141-148. This may allow for more effective cancellation of the offending crosstalk in a mating jack.

In particular, as shown in FIG. 9, a total of five offending crosstalk capacitors 181-185 are provided adjacent the plug blades 141-148. Capacitor 181 injects offending crosstalk between plug blades 142 and 143 (i.e., between differential transmission lines 172 and 173), capacitor 182 injects additional offending crosstalk between plug blades 142 and 143, capacitor 183 injects offending crosstalk between plug blades 143 and 144 (i.e., between differential transmission lines 171 and 173), capacitor 184 injects offending crosstalk between plug blades 145 and 146 (i.e., between differential transmission lines 171 and 173), and capacitor 185 injects offending crosstalk between plug blades 146 and 147 (i.e., between differential transmission lines 173 and 174).

As can be seen in FIG. 9, each of the five offending crosstalk capacitors 181-185 are configured to inject offending crosstalk at a location that is very near to the plug-jack mating region of each plug blade 141-148. In particular, the electrodes for each crosstalk capacitor 181-185 connect to the top edges of the conductive vias 132-137. Thus, the offending crosstalk that is generated by each offending crosstalk capacitor 181-185 is injected at the underside of the plug blades 142-147.

Moreover, as shown in FIG. 11, the point where the offending crosstalk generated by capacitors 181-185 is injected into the differential transmission lines 171-174 is almost at the plug-jack mating point of each respective plug blade 142-147. In particular, FIG. 11 is a schematic side cross-sectional view of the front portion of printed circuit board 150 (and plug blade 143) that shows where the jack contacts 142', 143' of a particular mating RJ-45 jack will be positioned when the plug 116 is fully received within the plug aperture of the jack. As shown in FIG. 11, the jack contacts may be aligned in two transverse rows, with four jack contacts in each transverse row (only jack contacts 142', 143' are visible in the side view of FIG. 11). The jackwire contacts 142', 143' in the rear transverse row (i.e., the row that includes jackwire contact 142') physically contact their respective plug blades (e.g., plug blade 142 for jack contact 142') directly over the respective conductive vias 132, 134, 136, 138. Thus, a signal that enters the back end of plug 116 need only flow through the thickness of plug blade 142 to reach the jackwire contact 142' (since the plug-jack mating point is directly opposite the location where the signal will be injected from the conductive via 132 into the plug blade 142. This distance is denoted by the arrow labeled "D" in FIG. 11. As the plug blade 142 may be quite thin (since low profile plug blades are used that may be, for example, about 10-20 mils thick), the offending crosstalk that is injected at the top of conductive via 132 is injected at a very short delay from the plug-jack mating region of plug blade 142 (i.e., at a delay corresponding to the time that the signal requires to traverse the thickness "D" of the plug blade 142). Similarly, the jackwire contacts in the front transverse row (i.e., the row that includes jackwire contact 143') physically contact their respective plug blades (e.g., plug blade 143 for jack contact 143') directly over the respective conductive vias 131, 133, 135, 137. Thus, a signal that enters the back end of plug 116 need only flow through the thickness of plug blade 143 to reach the jackwire contact 143' (since the plug-jack mating point is directly opposite the location where the signal will be injected from the conductive via 133 into the plug blade 143. Thus, the offending crosstalk that is injected at the top of conductive via 133 is also injected at a very short delay from the plug-jack mating region of plug blade 143 (i.e., at a delay corresponding to the time that the signal requires to traverse the thickness of the plug blade 143). As noted above, communications jacks may be designed that exhibit very high levels of crosstalk cancellation, even for high frequency signals, when the offending crosstalk is mostly introduced at very shot delays as is the case in the plug 116. The advantages of injecting much of the offending crosstalk near or even after the plug-jack mating point is discussed in detail in U.S. Pat. No. 8,197,286, issued Jun. 12, 2012, the entire contents of which is incorporated herein by reference as if set forth in its entirety. It will be appreciated that the plugs described herein and complimentary jacks may be used to implement the principals set forth in U.S. Pat. No. 8,197,286 for matching the locations of offending and compensating crosstalk vectors in mated plug-jack combinations.

Additionally, three offending crosstalk inductive coupling sections 186-188 are provided in the printed circuit board 150. In particular, as shown best in FIGS. 9 and 10, the conductive path 163 includes an additional conductive via 133-1. This additional conductive via 133-1 is used (instead of conductive via 133) to transfer signals from the trace on the bottom side of printed circuit board 150 that is part of conductive path 163 to the top side of the printed circuit board 150. The conductive via 133-1 may be longitudinally aligned with conductive via 133, and may be transversely aligned with conductive via 134. By moving the vertical signal-current carrying path for conductive path 163 rearwardly by using conductive via 133-1 instead of conductive via 133 for the current-carrying path, the vertical current-carrying path for conductive path 163 is moved closer to conductive via 134 and farther away from conductive via 135. The net effect of this change is to significantly increase the offending inductive crosstalk that is generated between differential transmission lines 171 and 173, as the currents flowing through conductive vias 133-1 and 134 will couple heavily (due to their close proximity), and the coupling between conductive via 133-1 and conductive via 135 will be low due to the increased distance therebetween. Thus, the conductive vias 133-1 and 134 together form a first offending crosstalk inductive coupling section 186 which generates offending inductive crosstalk between differential transmission lines 171 and 173.

In a similar fashion, the conductive path 165 includes an additional conductive via 135-1. This additional conductive via 135-1 is used instead of conductive via 135 to transfer signals from the trace on the bottom side of printed circuit board 150 that is part of conductive path 165 to the top side of the printed circuit board 150. The additional conductive via 135-1 is longitudinally aligned with conductive via 135, and is transversely aligned with conductive via 136. By moving the vertical signal-current carrying path for conductive path 135 rearwardly by using conductive via 135-1 instead of conductive via 135 for the current-carrying path, the vertical current-carrying path for conductive path 135 is moved closer to conductive via 136 and farther away from conductive via 133. The net effect of this change is to significantly increase the offending inductive crosstalk that is generated between differential transmission lines 171 and 173, as the currents flowing through conductive vias 135-1 and 136 will couple heavily (due to their close proximity), and the coupling between conductive vias 135-1 and 133 will be low due to the increased distance therebetween. Thus, the conductive vias 135-1 and 136 together form a second offending crosstalk inductive coupling section 187 which generates offending inductive crosstalk between differential transmission lines 171 and 173.

The offending inductive crosstalk circuits 186, 187 inject the offending crosstalk close to the plug-jack mating points on the plug blades 143-146 of differential transmission lines 171, 173 (albeit not as close as the capacitive offending crosstalk circuits 181-185). The offending inductive crosstalk is generated in the vertical conductive vias 133-1, 134, 135-1, 136 because higher levels of inductive coupling can generally be generated in the conductive via structures than can be generated, for example, through the use of inductively coupling side-by-side conductive traces on the printed circuit board 150. Note that two additional conductive vias 134-1 and 135-2 are provided through the printed circuit board 150. The conductive vias 134-1 and 135-2 are provided to transfer the conductive paths 164 and 165, respectively, from the top surface to the bottom surface of printed circuit board 150 so that current will flow through conductive vias 134 and 135-1, as is necessary for proper operation of the offending inductive crosstalk circuits 186, 187, and to also arrange the direction of current flow through conductive vias 133-1, 134, 135-1, 136 so that inductive coupling will occur between vias 133-1 and 134 and between vias 135-1 and 136. Conductive traces which connect vias 135-1 and 135-2, and which connect vias 134 and 134-1, provide additional inductive coupling to adjacent sections of conductive paths 166 and 163, respectively, thereby generating additional inductive offending crosstalk between pairs 1 and 3.

While larger capacitors could be used in offending crosstalk circuits 183-184 to generate the industry standard specified amounts of offending crosstalk between differential transmission lines 171 and 173, if only capacitive offending crosstalk is used, it may be more difficult to adequately compensate for both NEXT and FEXT in a jack that mates with plug 116. By providing the inductive crosstalk compensation circuits 186, 187, it has been found that more effective cancelling of both NEXT and FEXT may be achieved in the mating jack.

Additionally, as shown best in FIG. 10, a third offending inductive crosstalk circuit 188 is provided in the form of a section on the bottom side of the printed circuit board where conductive paths 166 and 167 are run side-by-side. Offending inductive crosstalk circuit 188 injects offending inductive crosstalk between transmission lines 173 and 174 in order to meet the specified offending FEXT requirements in the Category 6a standard.

As noted above, the plug 116 may be designed to mostly inject the industry standardized levels of offending crosstalk between the differential transmission lines at locations close to the plug-jack mating points of plug blades 141-148. Various features of plug 116 that may facilitate reducing the amount of offending crosstalk that is injected farther back in the plug 116 will now be described.

First, the conductors 101-108 terminate onto both the top and bottom sides of the printed circuit board 150 (i.e., four conductors terminate onto each side of the printed circuit board 150). This allows the conductors 101-108 of different differential pairs to be spaced apart a greater distance along the transverse dimension, which reduces crosstalk between the pairs, and also facilitates maintaining the twist in the conductors up to almost the points of termination (which further helps mitigate crosstalk). Likewise, the conductive traces that form the conductive paths 161-168 are arranged in pairs that are generally spaced far apart from each other in order to reduce or minimize coupling between the differential transmission lines 171-174 until those transmission lines reach the front section of the printed circuit board 150 underneath the plug blades 141-148.

Additionally, the back end of plug 116 includes a cruciform separator 130 that spaces the conductor pairs 101, 102; 103, 106; 104, 105; 107, 108 apart from each other in order to reduce coupling. In some embodiments, the separator 130 may be plated with a conductive material (or formed of a conductive material) in order to enhance its shielding properties.

As is shown in FIGS. 9 and 10, a pair of reflection or "image" planes 190, 192 are included in the printed circuit board 150. The first image plane 190 is located just below a top surface of the printed circuit board 150, and the second image plane 192 is located just above a bottom surface of the printed circuit board 150. Each image plane 190, 192 may be implemented as a conductive layer on the printed circuit board 150. In some embodiments, the image planes 190, 192 may be grounded by, for example, connecting each image plane to a ground wire, drain wire or other ground reference so that each image plane 190, 192 will act as a ground plane. However, in other embodiments, the image planes 190, 192 may not be electrically grounded (i.e., they are left floating electrically). The image planes 190, 192, whether or not they are electrically grounded, may act as shielding structures that reduce coupling between the portions of conductive traces 161-168 that are on the top side of the printed circuit board 150 and the portions of conductive traces 161-168 that are on the bottom side of the printed circuit board 150.

The plugs (and patch cords that include such plugs) according to embodiments of the present invention may exhibit outstanding crosstalk performance. As described above, in some embodiments, the plugs may include low profile plug blades. These plug blades may each include a first section that extends longitudinally along a top surface of the printed circuit board (in direct contact with the top surface of the printed circuit board). As described above, the signal current injection point into these first segments of the plug contacts may be in a middle portion of the first segments. This configuration can allow, for example, for shorter signal current carrying paths through the plug blades. This configuration may also allow a staggering of the signal current carrying path through adjacent plug blades. Thus, the signal current-carrying path through each of the plug contacts may be offset in a longitudinal dimension of the plug from the signal current-carrying path of at least an adjacent one of the plug contacts. However, it will be appreciated that in other embodiments longer signal current carrying paths and/or overlapping signal current carrying paths may be provided between adjacent plug blades. For example, in an alternative embodiment the offending inductive crosstalk circuits 186, 187 may be replaced with offending inductive crosstalk circuits that are implemented in adjacent plug blades.

In some embodiments, the plug-jack mating point on at least some of the plug blades may be substantially opposite the point on each plug blade where signal currents are injected into the plug blade from the printed circuit board. This also may result in reducing the length of the signal current carrying paths through the respective plug blades. For example, in some embodiments, a minimum signal current-carrying path through at least some of the first plug contacts (i.e., the minimum distance that the signal current must travel in passing from the printed circuit board to a mating jackwire contact) may be less than twice a height of the first plug contact above a top surface of the printed circuit board.

In some embodiments, each plug contact may comprise a longitudinally extending first segment that extends along a top surface of the printed circuit board and a downwardly extending second segment that extends along a front edge of the printed circuit board. Substantially the entirety of the first segment and the second segment of each plug contact may rest directly on the top surface of the printed circuit board. In some embodiments, the plug blades may extend less than 90 mils above a top surface of the printed circuit board. In some embodiments, the plug blades may be low profile blades that extend more than 60 mils above a top surface of the printed circuit board and may be no more than 30 mils above a top surface of the printed circuit board.

In some embodiments, the signal current injection points into a first subset of the plug contacts may be aligned in a first transverse row, and the signal current injection points into a second subset of the plug contacts may be aligned in a second row that is offset from the first row. Each plug contact may be mounted in a respective one of a plurality of conductive vias in the printed circuit board through a downwardly extending projection that is provided on each plug contact. These conductive vias may also be aligned in multiple rows so that a first subset of the vias is staggered with respect to a second subset of the vias. In some embodiments, the plug may further include at least one additional conductive via that inductively couples with another conductive via (e.g., a via that is used to mount a plug blade) to form an inductive offending crosstalk circuit.

In some embodiments, at least one offending crosstalk capacitor may be provided that injects offending crosstalk between two of the differential transmission lines through the plug. This capacitor may be implemented on the printed circuit board, and may inject the offending crosstalk substantially at a first interface between a first plug contact and the printed circuit board and at a second interface between a second plug contact and the printed circuit board. In other embodiments, the offending crosstalk capacitor may be configured to inject offending crosstalk between the differential pairs at a point in time that is after the point in time when a signal transmitted through the plug contact to a contact of a mating jack reaches the contact of the mating jack.

Figure 12:
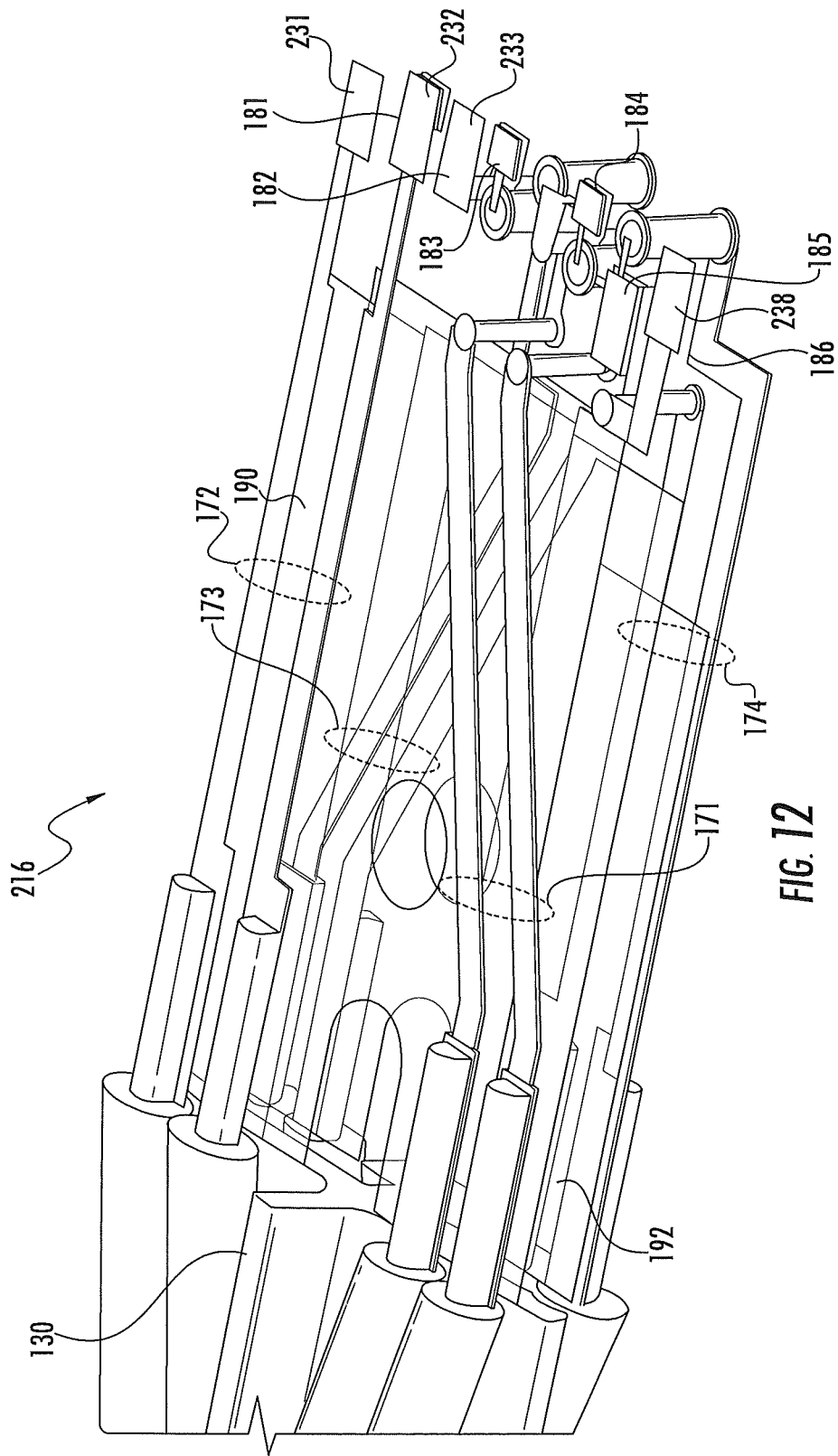
FIG. 12 is a top, partial perspective view of a printed circuit board of a plug according to further embodiments of the present invention.

FIG. 12 is a top, partial perspective view of a plug 216 according to further embodiments of the present invention. The plug 216 may be identical to the plug 116 described above with reference to FIGS. 3-11, except that in the plug 216, the conductive vias 131, 132, 133 and 138 have been omitted and replaced with contact pads 231, 232, 233 and 238, respectively. Plug blades 141, 142, 143 and 148 (see FIG. 10) are soldered to the respective contact pads 231, 232, 233 and 238. This may reduce capacitive coupling between the conductive vias 131-138 that the plug blades are mounted in, as some of the conductive vias are omitted. In particular, in some designs the conductive vias 131-138 may not be staggered sufficiently (in transverse rows) in order to become "neutral" in terms of crosstalk generation. As such, offending crosstalk may be generated between adjacent conductive vias. If some of the conductive vias are removed, this offending coupling is eliminated for those vias. Additional coupling may be provided, for example, by increasing the capacitance of the offending crosstalk circuits 181-185 in order to ensure that the industry standardized amounts of offending crosstalk are generated in the plug. This may facilitate generally increasing the degree to which the offending crosstalk is pushed forward in time toward (or even after) the plug-jack mating point. It will be appreciated that any or all of the conductive vias 131-138 may be omitted and replaced with, for example, contact pads such as contact pads 231, 232, 233 and 238.

Figure 13:
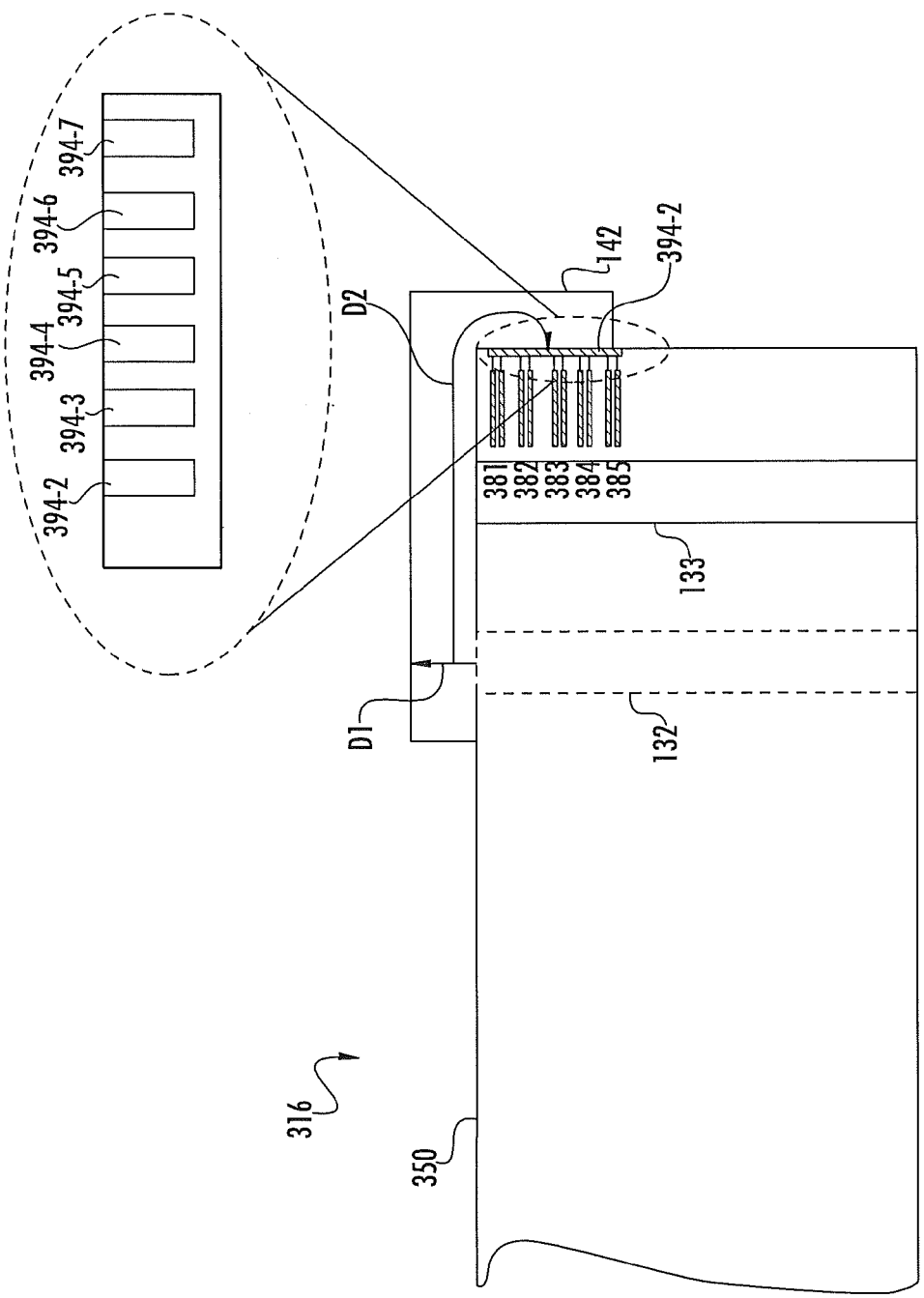
FIG. 13 is a schematic side view of the front portion of a printed circuit board of a plug according to still further embodiments of the present invention.

FIG. 13 is a schematic side view of the front portion of a printed circuit board 350 and plug contacts (only plug contact 142 is visible in the side view of FIG. 13) of a plug 316 according to still further embodiments of the present invention. The plug 316 may be identical to the plug 116 described above with reference to FIGS. 3-11, except as noted below.

As shown in FIG. 13, six downwardly extending, rectangular contact pads 394-2 through 394-7 (only contact pad 394-2 is visible in the side cross-sectional view FIG. 13; the callout in FIG. 13 is a front view of the printed circuit board 350 with the plug contacts removed that shows all of contact pads 394-2 through 394-7) are disposed along the front edge of the printed circuit board 350. The second, downwardly extending segment of each plug contact 142-147 may rest directly on a respective one of the six contact pads 394-2 through 394-7, thereby electrically connecting the second (distal) end of each plug blade 142-147 to the printed circuit board 350. The offending crosstalk capacitors 181-185 of the plug 116 of FIGS. 3-11 may be replaced with capacitors 381-385. Each capacitor 381-385 has a first electrode that is electrically connected to a first of the contact pads 394-2 through 394-7 and a second electrode that is electrically connected to a second of the contact pads 394-2 through 394-7. In particular, capacitor 381 is electrically connected to contact pads 394-2 and 394-3 and injects offending crosstalk between blades 142 and 143 (i.e., between differential transmission lines 172 and 173), capacitor 382 is also electrically connected to contact pads 394-2 and 394-3 and injects offending crosstalk between blades 142 and 143 (i.e., between differential transmission lines 172 and 173), capacitor 383 is electrically connected to contact pads 394-3 and 394-4 and injects additional offending crosstalk between blades 143 and 144 (i.e., between differential transmission lines 171 and 173), capacitor 384 is electrically connected to contact pads 394-5 and 394-6 and injects offending crosstalk between blades 145 and 146 (i.e., between differential transmission lines 171 and 173), and capacitor 385 is electrically connected to contact pads 394-6 and 394-7 and injects offending crosstalk between blades 146 and 147 (i.e., between differential transmission lines 173 and 174).

The printed circuit board 350 is very similar to the printed circuit board 150, with the differences being the inclusion of the six contact pads 394-2 through 394-7 and the replacement of capacitors 181-185 with capacitors 381-385 which are similar, but which connect at a different location to the differential transmission lines 171-174 through the plug 316. This difference in location impacts the time at which the offending capacitive crosstalk is injected onto each differential transmission line 171-174. In particular, as shown in FIG. 13, a signal that enters the back end of a plug that includes printed circuit board 350 will pass through via 132 and into plug contact 142. After travelling a distance D1 through plug contact 142, this signal will pass from plug blade 142 onto a jackwire contact of a mating communications jack. The signal will also pass to the front of plug blade 142 where it will capacitively couple via capacitor 381 with adjacent plug blade 143. However, since the distance from the top of via 132 to capacitor 381 (distance D2 in FIG. 13) is substantially greater than distance D1, the net effect is that the offending crosstalk generated by capacitor 381 (which couples energy between plug blades 142 and 143) will appear after the plug-jack mating point, since the signal will have already passed into the jack (along the arrow labeled D1 in FIG. 13) before the signal reaches capacitor 381.

As noted above, improved performance may be obtained in some embodiments if the offending crosstalk in the plug is injected near the plug-jack mating point or even after the plug-jack mating point (for signals travelling from the plug to the jack). The advantages of injecting much of the offending crosstalk near or even after the plug-jack mating point is discussed in detail in the above-discussed U.S. Pat. No. 8,197, 286. As discussed in this patent, jacks may be designed that have first stage compensating crosstalk injection circuits that will inject compensating crosstalk at approximately the same time that the offending crosstalk is injected. This may cancel the offending crosstalk at all frequencies, providing much higher levels of crosstalk compensation. The printed circuit board 350 may be used to implement the techniques disclosed in U.S. Pat. No. 8,197,286 where much of the offending crosstalk can be designed so that it is injected after the plug jack mating point, and preferably at the same time delay as compensating crosstalk having the opposite polarity, in order to cancel much of the offending crosstalk at all frequencies, thereby obtaining improved levels of crosstalk cancellation.

Figure 14:
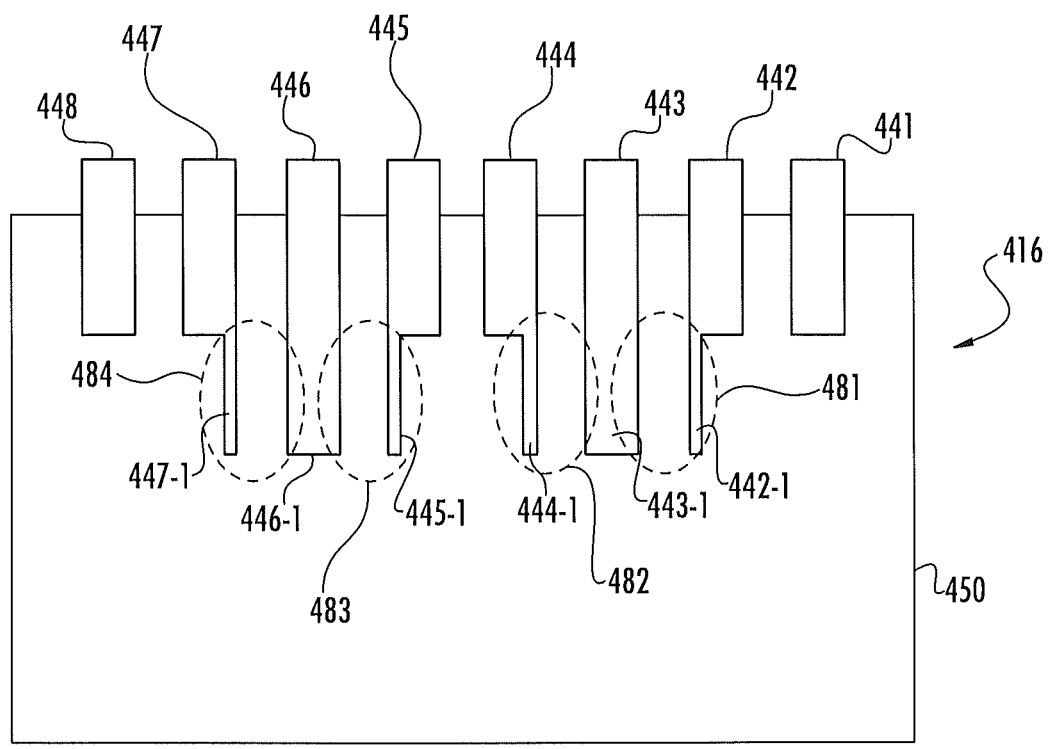
FIG. 14 is a schematic front view of plug contacts that may be included in plugs according to further embodiments of the present invention.

FIG. 14 is a schematic front view of portions of a plug 416 according to further embodiments of the present invention. In particular, FIG. 14 pictures the plug contacts 441-448 and the printed circuit board 450 of plug 416.

The plug 416 may be identical to the plug 116 except for in the following ways. First, the plug blades 142-147 of plug 116 are replaced with the plug blades 442-447 depicted in FIG. 14 (plug blades 441 and 448 remain unchanged from plug blades 141 and 148 in plug 116). The plug blades 442-447 may be identical to the plug blades 142-147 except that the plug blades 442-447 include plates 442-1 through 447-1 that extend downwardly from the second segment of plug blades 442-447. These plates 442-1 through 447-1 may be used as offending crosstalk capacitors. In particular, plates 442-1 and 443-1 form a first offending crosstalk capacitor 481, plates 443-1 and 444-1 form a second offending crosstalk capacitor 482, plates 445-1 and 446-1 form a third offending crosstalk capacitor 483, and plates 446-1 and 447-1 form a fourth offending crosstalk capacitor 484. As the capacitors 481-484 are located at the distal end of the plug blades and are far removed from the signal current-carrying path through the plug blades 441-448 (which will be identical to the signal current-carrying paths in plug blades 141-148 as discussed above), the capacitors 481-484 may inject offending crosstalk after the plug-jack mating point.

As is further shown in FIG. 14, plates 443-1 and 446-1 are thick plates that have the same width (in the transverse dimension of the plug) as the remainder of the plug blade, while plates 442-1, 444-1, 445-1 and 447-1 are thin plates that have widths that are substantially smaller than the width of the remainder of the plug blades. Thinner plates 442-1, 444-1, 445-1 and 447-1 are used on plug blades that are adjacent to another plug blade of the same differential pair, as this may improve the return loss performance of the plug. For example, the plate 442-1 that extends downwardly from plug blade 442 is a thin plate that is positioned to be close to plate 443-1 and to be farther away from plug blade 441. In this manner, an offending crosstalk capacitor 481 is formed, without substantially increasing the capacitive loading between plug blades 441 and 442. Additional capacitive loading between the plug blades 441 and 442 (which are part of the same differential transmission line 172) may negatively impact the return loss in differential transmission line 172. Thus, by using the thin plate 442-1 it may be possible to provide an offending crosstalk capacitor between plug blades 442 and 443 without substantially increasing the capacitive loading between plug blades 441 and 442. The use of thin plates 444-1, 445-1 and 447-1 similarly provides offending crosstalk capacitors 482-484 while limiting the amount of additional capacitive loading between the plug blades of differential transmission lines 171 and 174. Thinner extensions need not be provided on plug blades 443 and 446 as these blades are on the "split pair" and hence do not substantially capacitively couple to each other.

The present invention is not limited to the illustrated embodiments discussed above; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "top," "bottom," "side," "upper," "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Herein, the term "signal current carrying path" is used to refer to a current carrying path on which an information signal will travel on its way from the input to the output of a communications plug. Signal current carrying paths may be formed by cascading one or more conductive traces on a wiring board, metal-filled apertures that physically and electrically connect conductive traces on different layers of a printed circuit board, portions of plug blades, conductive pads, and/or various other electrically conductive components over which an information signal may be transmitted. Branches that extend from a signal current carrying path and then dead end such as, for example, a branch from the signal current carrying path that forms one of the electrodes of an inter-digitated finger or plate capacitor, are not considered part of the signal current carrying path, even though these branches are electrically connected to the signal current carrying path. While a small amount of current will flow into such dead end branches, the current that flows into these dead end branches generally does not flow to the output of the plug that corresponds to the input of the plug that receives the input information signal.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, integers, steps, operations, elements, and/or components, but do not preclude the presence or addition of one or more other features, integers, steps, operations, elements, components, and/or groups thereof.

All of the above-described embodiments may be combined in any way to provide a plurality of additional embodiments.

The foregoing is illustrative of the present invention and is not to be construed as limiting thereof. Although exemplary embodiments of this invention have been described, those skilled in the art will readily appreciate that many modifications are possible in the exemplary embodiments without That which is claimed is:

1. A patch cord comprising:
   a communications cable that includes at least a first conductor, a second conductor, a third conductor and a fourth conductor; and
   a plug that is attached to the communications cable, the plug comprising:
      a housing that receives the communications cable;
      a printed circuit board that is at least partly within the housing;
      a first plug contact, a second plug contact, a third plug contact and a fourth plug contact that each are at least partially within the housing;
      a first conductive path that connects the first conductor to the first plug contact, a second conductive path that connects the second conductor to the second plug contact, a third conductive path that connects the third conductor to the third plug contact, and a fourth conductive path that connects the fourth conductor to the fourth plug contact,
      wherein the first and second conductors, the first and second conductive paths, and the first and second plug contacts form a first differential transmission line through the plug and the third and fourth conductors, the third and fourth conductive paths, and the third and fourth plug contacts form a second differential transmission line through the plug, and
      wherein each of the first through fourth plug contacts has a first segment that extends longitudinally along a top surface of the printed circuit board and a second segment that extends vertically along a front end of the printed circuit board, and wherein a signal current injection point into the first segment of at least some of the first through fourth plug contacts is into middle portions of their respective first segments.

2. The patch cord of claim 1, wherein the plug-jack mating point on the first plug contact is on a first side of the first plug contact and wherein the signal current injection point into the first plug contact is on a second side of the first plug contact that is opposite the first side and is also substantially opposite the plug-jack mating point on the first plug contact.

3. The patch cord of claim 2, wherein substantially the entirety of the first segment of the first plug contact rests directly on the top surface of the printed circuit board.

4. The patch cord of claim 1, wherein a minimum signal current-carrying path through the first plug contact is less than twice a height of the first plug contact above the top surface of the printed circuit board.

5. The patch cord of claim 1, wherein the respective signal current injection points into the first and third plug contacts are aligned in a first transverse row, and the respective signal current injection points into the second and fourth plug contacts are offset from the first row.

6. The patch cord of claim 5, wherein the respective signal current injection points into the second and fourth plug contacts are aligned in a second transverse row.

7. The patch cord of claim 1, wherein the printed circuit board includes a plurality of conductive vias, wherein each of the first through fourth plug contacts has a projection that is received within a respective one of the conductive vias, and wherein the conductive vias that receive the projections of the first and third plug contacts are aligned in a first row, and the conductive vias that receive the projections of the second and fourth plug contacts are offset from the first row.

8. The patch cord of claim 7, wherein the conductive vias that receive the projections of the second and fourth plug contacts are aligned in a second row.

9. The patch cord of claim 1, wherein the first segments of the first through fourth plug contacts are substantially identical and are transversely aligned in a row.

10. The patch cord of claim 1, wherein the plug comprises an RJ-45 plug that further includes fifth and sixth plug contacts that are part of a third differential transmission line through the plug and seventh and eighth plug contacts that are part of a fourth differential transmission line through the plug, wherein the first, third, fifth and seventh plug contacts are mounted in respective first through fourth conductive vias that are substantially aligned in a first row and the second, fourth, sixth and eighth plug contacts are mounted in respective fifth through eighth conductive vias that are substantially aligned in a second row that is offset from the first row.

11. The patch cord of claim 1, wherein the first through fourth plug contacts extend no more than 60 mils above the top surface of the printed circuit board.

12. The patch cord of claim 1, wherein the signal current-carrying path through each of the first through fourth plug contacts is offset in a longitudinal dimension of the plug from the signal current-carrying path of at least an adjacent one of the first through fourth plug contacts.

13. The patch cord of claim 1, further comprising an offending crosstalk capacitor that injects offending crosstalk between the second conductive path and the third conductive path.

14. The patch cord of claim 13, wherein the offending crosstalk capacitor comprises a printed circuit board capacitor that injects offending crosstalk onto the second conductive path substantially at a first interface between the second plug contact and the printed circuit board, and wherein the offending crosstalk capacitor injects offending crosstalk onto the third conductive path substantially at a second interface between the third plug contact and the printed circuit board.

15. The patch cord of claim 13, wherein the offending crosstalk capacitor is configured to inject offending crosstalk onto the second conductive path at a point in time that is after the point in time when a signal transmitted through the second plug contact to a contact of a mating jack reaches the contact of the mating jack.

16. A patch cord comprising:
   a communications cable that includes at least a first conductor, a second conductor, a third conductor and a fourth conductor; and
   an RJ-45 plug that is attached to a first end of the communications cable, the plug comprising:
      a housing that receives the communications cable;
      a printed circuit board that is at least partly within the housing;
      a first plug contact, a second plug contact, a third plug contact and a fourth plug contact that each are at least partially within the housing;
      a first conductive path that connects the first conductor to the first plug contact, a second conductive path that connects the second conductor to the second plug contact, a third conductive path that connects the third conductor to the third plug contact, and a fourth conductive path that connects the fourth conductor to the fourth plug contact,
      wherein the first and second conductors, the first and second conductive paths, and the first and second plug contacts form a first differential transmission line through the plug and the third and fourth conductors, the third and fourth conductive paths, and the third and fourth plug contacts form a second differential transmission line through the plug, and wherein a minimum signal current-carrying path through each of the first through fourth plug contacts is less than twice a respective height of top surfaces of the respective first through fourth plug contacts above a first surface of the printed circuit board.

17. The patch cord of claim 16, wherein the signal current-carrying path through each of the first through fourth plug contacts is offset in a longitudinal dimension of the plug from the signal current-carrying path of at least an adjacent one of the first through fourth plug contacts.

18. The patch cord of claim 16, wherein the plug-jack mating point on the first plug contact is on a first side of the first plug contact and wherein the signal current injection point into the first plug contact is on a second side of the first plug contact that is opposite the first side and is also substantially opposite the plug-jack mating point on the first plug contact.

19. The patch cord of claim 16, wherein a minimum signal current-carrying path through the first plug contact is substantially equal to the height of the first plug contact above the first surface of the printed circuit board.

20. The patch cord of claim 16, further comprising an offending crosstalk capacitor that injects offending crosstalk between the second conductive path and the third conductive path.

21. The patch cord of claim 20, wherein the offending crosstalk capacitor is configured to inject offending crosstalk onto the second conductive path at a point in time that is after the point in time when a signal transmitted through the second plug contact to a contact of a mating jack reaches the contact of the mating jack.

22. The patch cord of claim 20, wherein the offending crosstalk capacitor is formed in the printed circuit board and is electrically connected to the second and third plug contacts via respective electrical connections that are different than the electrical connections that are part of the signal current-carrying paths between the second and third plug contacts and the printed circuit board.

* * * * *